United States Patent
Kang et al.

(10) Patent No.: US 7,221,606 B2
(45) Date of Patent: May 22, 2007

(54) SEMICONDUCTOR MEMORY DEVICE FOR LOW POWER SYSTEM COMPRISING SENSE AMPLIFIER WITH OPERATING VOLTAGES LOWER/HIGHER THAN GROUND/VOLTAGE SUPPLY AND AUXILIARY SENSE AMPLIFIER

(75) Inventors: Hee-Bok Kang, Kyoungki-do (KR); Jin-Hong Ahn, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 105 days.

(21) Appl. No.: 11/030,777

(22) Filed: Jan. 6, 2005

(65) Prior Publication Data
US 2006/0092732 A1 May 4, 2006

(30) Foreign Application Priority Data
Oct. 30, 2004 (KR) .................. 10-2004-0087651

(51) Int. Cl.
*G11C 7/02* (2006.01)
(52) U.S. Cl. .................. 365/208; 365/190; 365/205; 365/207; 365/210
(58) Field of Classification Search ........... 365/189.01, 365/189.09, 190, 205, 207, 208, 210
See application file for complete search history.

(56) References Cited

U.S. PATENT DOCUMENTS

| 5,235,550 | A | | 8/1993 | Zagar |
| 5,659,260 | A | * | 8/1997 | Kajimoto et al. ............. 327/55 |
| 5,970,007 | A | * | 10/1999 | Shiratake ..................... 365/207 |
| 6,078,538 | A | | 6/2000 | Ma et al. |
| 6,097,620 | A | | 8/2000 | Naritake |
| 6,392,303 | B2 | * | 5/2002 | Keeth ......................... 257/776 |
| 6,407,956 | B2 | * | 6/2002 | Ooishi ......................... 365/205 |
| 6,678,199 | B1 | | 1/2004 | Joo |
| 6,804,164 | B2 | * | 10/2004 | Fujino et al. .......... 365/230.08 |

FOREIGN PATENT DOCUMENTS

JP 2001-307479 11/2001

* cited by examiner

*Primary Examiner*—VanThu Nguyen
(74) *Attorney, Agent, or Firm*—Blakely Sokoloff Taylor & Zafman

(57) ABSTRACT

An apparatus included in a semiconductor memory device for precharging a bit line and a bit line bar and sensing and amplifying a data delivered to one of the bit line and the bit line bar includes a precharge means for precharging the bit line and the bit line bar as a ground; a sense amplifying means for sensing and amplifying the data by using a low voltage having a lower voltage level than the ground and a high voltage having a higher voltage level than a supply voltage; and an auxiliary sense amplifying means coupled to the bit line and the bit line bar for controlling each voltage level of the bit line and the bit line bar.

41 Claims, 16 Drawing Sheets

SEMICONDUCTOR MEMORY DEVICE FOR LOW POWER SYSTEM COMPRISING SENSE AMPLIFIER WITH OPERATING VOLTAGES LOWER/HIGHER THAN GROUND/VOLTAGE SUPPLY AND AUXILIARY SENSE AMPLIFIER

FIELD OF INVENTION

The present invention relates to a semiconductor memory device; and, more particularly, to a semiconductor memory device for decreasing a power consumption under a low supply voltage.

DESCRIPTION OF PRIOR ART

Generally, a semiconductor memory device is operated under a supply voltage inputted from an external circuit or a low internal voltage generated by a voltage generator included in the semiconductor memory device. Particularly, people skilled in the art focus how to make a supply voltage supplied to the semiconductor memory device become lower if an operating speed of the semiconductor memory device is not decreased.

FIG. 1 is a block diagram showing a core area of a conventional semiconductor memory device.

As shown, the conventional semiconductor memory device includes a row address decoder 20, a column address decoder 30, a cell area 100 and a data input/output block 40.

The cell area 100 includes a plurality of cell arrays, e.g., 110, 120, 130 and 140 and a plurality of sense amplifying blocks, e.g., 150 and 160. The row address decoder 20 receives a row address and decodes the row address in order to access a data stored in the cell area 100; and the column address decoder 30 receives a column address and decodes the column address in order to access the data stored in the cell area 100. The data input/output block 40 is for outputting a data stored in the cell area 100 or delivering data inputted through a data pad/pin into the dell area 100.

That is, during a read operation, the data accessed in response to the row address and the column address is outputted to the data input/output block 40. Otherwise, under a write operation, a data inputted from an external circuit is stored in an unit cell corresponding to the row address and the column address through the data input/output block 40.

In detail, each cell array, e.g., 110, included in the cell area 100 includes a plurality of unit cells, each for storing a data; and each sense amplifying block, e.g., 150, is for sensing and amplifying data outputted from each cell array.

FIG. 2 is a block diagram depicting a detailed structure of the cell area 100 shown in FIG. 1.

As shown, a first cell array 110 includes a plurality of bit line pairs, e.g., BL and /BL, a plurality of cells, e.g., CELL1, CELL2 and CELL3, and a plurality of word lines, e.g., WL0 to WL5. Herein, each cell is constituted with one capacitor and one transistor. For instance, a first cell CELL1 includes a first capacitor C0 coupled to a plate line PL and a first MOS transistor M0 having a gate coupled to a first word line WL0. The first MOS transistor M0 is coupled between the first capacitor C0 and a bit line BL for connecting or disconnecting the first capacitor C0 to a bit line BL in response to a word line WL0.

Also, the first cell CELL1 and a second cell CELL2 respectively coupled to the first word line WL0 and a second word line WL1 and neighbored with each other are commonly connected to the bit line BL; and the bit line BL is coupled to a sense amplifier 152a included in the sense amplifying block 150.

For reading a data stored in the first cell CELL1, the first word line W0 is selected and activated; then, as a result, the first MOS transistor M0 is turned on. The data stored in the first capacitor C0 is delivered into the bit line BL.

Next, the sense amplifier 152a senses and amplifies the data by using a potential difference between the bit line BL receiving the data delivered through the first MOS transistor M0 and a bit line bar /BL receiving no data outputted from any cell included in the first cell array 110.

After above described sensing and amplifying operations by the sense amplifier 152a, the amplified data is outputted through a local data bus pair LDB and LDBB to the external circuit. Herein, under the sensing and amplifying operations, the sense amplifier 152a determines logic levels of the bit line BL and the bit line bar /BL. Also, each logic level of the bit line BL and the bit line bar /BL is transmitted to each of a local data bus LDB and a local data bus bar LDBB.

That is, if the first cell CELL1 stores a data being a logic high level "1", i.e., the first capacitor C0 is charged, the bit line BL has a voltage level of a supply voltage VDD and the bit line bar /BL has a voltage level of a ground GND after the sensing and amplifying operations. Otherwise, i.e., if the first cell CELL1 stores a data being a logic low level "0", the bit line BL has a voltage level of the ground GND and the bit line bar /BL has a voltage level of the supply voltage VDD after the sensing and amplifying operations.

Since an amount of charge stored in each capacitor of each cell is a little, the charge should be restored in a capacitor of each original cell after the charge is delivered into the bit line BL. After completing the restoration by using a latched data of the sense amplifier, a word line corresponding to the original cell is inactivated.

Herein, it is described when a data stored in the third cell CELL3 is read. If the third cell CELL3 stores a data being a logic high level "1", i.e., the third capacitor C2 is charged, the bit line bar /BL has a voltage level of a supply voltage VDD and the bit line BL has a voltage level of a ground GND after the sensing and amplifying operations. Otherwise, i.e., if the third cell CELL3 stores a data being a logic low level "0", the bit line bar /BL has a voltage level of the ground GND and the bit line BL has a voltage level of the supply voltage VDD after the sensing and amplifying operations.

Further, in the write operation, i.e., when an inputted data is stored in the cell area, a word line corresponding to inputted row and column addresses is activated and, then, a data stored in a cell coupled to the word line is sensed and amplified. After then, the amplified data is substituted with the inputted data in the sense amplifier 152a. That is, the inputted data is latched in the sense amplifier 152a. Next, the inputted data is stored in the cell corresponding to the activated word line. If it is completed to store the inputted data in the cell, the word line corresponding to the inputted row and column addresses is inactivated.

FIG. 3 is a block diagram describing a connection between each cell array and each sense amplifying block included in the cell area 100 shown in FIG. 1. Particularly, the conventional semiconductor memory device has a shared bit line sense amplifier structure. Herein, the shared bit line sense amplifier structure means that two neighbor cell arrays are coupled to one sense amplifying block.

As shown, there are a plurality of cell arrays 110, 130 and 180 and a plurality of sense amplifying blocks 150 and 170. The first sense amplifying block 150 is coupled to the first cell array 110 and the second cell array 130; and the second sense amplifying block 170 is coupled to the second cell array 130 and the fifth cell array 180.

If one cell array is coupled to one sense amplifying block, the sense amplifying block includes a plurality of sense amplifiers each corresponding to each bit line pair included in the cell array. That is, the number of the sense amplifiers included in the sense amplifying block is same to the number of bit lines included in the cell array. However, referring to FIG. 3, since two cell arrays hold one sense amplifying block in common under the shared bit line sense amplifier structure, the sense amplifying block has a number of sense amplifiers each corresponding to each two bit line pairs. That is, the number of the sense amplifiers included in the sense amplifying block can be decreased by half.

Under the shared bit line sense amplifier structure for implementing a higher integrated circuit, the sense amplifying block, e.g., 150, further includes a first connection block 151 and a second connection block 153. Since the sense amplifying block is commonly coupled to two neighbor cell arrays 110 and 130, there should be control for connecting or disconnecting the first sense amplifying block 150 to one of the two neighbor cell arrays 110 and 130. Each of the first and the second connection blocks 151 and 153 has a plurality of switching units, e.g., transistors. The plurality of transistors, e.g., MN1 to MN4, in the first connection block 151 is turned on or off based on a first connection control signal BISH1; and the plurality of transistors, e.g., MN5 to MN8, in the second connection block 153 is turned on or off based on a second connection control signal BISL1.

For instance, if the first connection control signal BISH1 is activated, all transistors included in the first connection block 151 is turned on, that is, the first cell array 110 is coupled to the sense amplifier block 152 of the first sense amplifying block 150. Otherwise, if the second connection control signal BISL1 is activated, all transistors included in the second connection block 153 is turned on, that is, the second cell array 130 is coupled to the sense amplifier block 152 of the first sense amplifying block 150.

Likewise, another sense amplifying block 170 includes a plurality of sense amplifiers and two connection blocks controlled in response to other connection control signals BISH2 and BISL2 for connecting or disconnecting a sense amplifier block of the sense amplifying block 170 to one of the two neighbor cell arrays 130 and 180.

Moreover, each sense amplifying block, e.g., 150, further includes a precharge block and a data output block except for connection blocks and sense amplifiers.

FIG. 4 is a block diagram depicting the sense amplifying block 150 shown in FIG. 2.

As shown, the sense amplifying block 150 includes a sense amplifier 152a, a precharge block 155a, first and second equalization blocks 154a and 157a and a data output block 156a.

The sense amplifier 152a receives power supply signals SAP and SAN for amplifying a potential difference between the bit line BL and the bit line bar /BL. Enabled by a precharge signal BLEQ when the sense amplifier 152a is not activated, the precharge block 155a is for precharging the bit line pair BL and /BL as a bit line precharge voltage VBLP. In response to the precharge signal BLEQ, the first equalization block 154a makes a voltage level of the bit line BL be same to a voltage level of the bit line bar /BL. Similar to the first equalization block 154a, the second equalization block 157a is also used for making a voltage level of the bit line BL be same to a voltage level of the bit line bar /BL.

Lastly, the data output block 156a outputs a data amplified by the sense amplifier 152a to the local data bus pair LDB and LDBB based on a column control signal YI generated from a column address.

Herein, the sense amplifying block 150 further includes two connection blocks 151a and 153a each for connecting or disconnecting the sense amplifier 152a to one of neighbor cell arrays respectively based on connection control signals BISH and BISL.

FIG. 5 is a waveform showing an operation of the conventional semiconductor memory device. Hereinafter, referring to FIGS. 1 to 5, the operation of the conventional semiconductor memory device is described in detail.

As shown, the read operation can be split into four steps: a precharge step, a read step, a sense step and a restore step. Likewise, the write operation is very similar to the read operation. However, the write operation includes a write step instead of the read step in the read operation and, more minutely, not a sensed and amplified data is not outputted but an inputted data from an external circuit is latched in the sense amplifier during the sense step.

Hereinafter, it is assumed that a capacitor of a cell is charged, i.e., stores a logic high data "1". Herein, a symbol 'SN' means a potential level charged in the capacitor of the cell. Also, one of two connection blocks in the sense amplifying block is activated and the other is inactivated. As a result, the sense amplifying block is coupled to one of two neighbor cell arrays.

In the precharge step, the bit line BL and the bit line bar /BL are precharged by the bit line precharge voltage VBLP. At this time, all word line are inactivated. Generally, the bit line precharge voltage VBLP is a ½ core voltage, i.e., ½ Vcore=VBLP.

When the precharge signal BLEQ is activated as a logic high level, the first and second equalization blocks 154a and 157a are also enabled. Thus, the bit line BL and the bit line bar /BL are percharged as the ½ core voltage. Herein, the first and second connection block 151a and 153a are also activated, i.e., all transistors included in the first and second connection block 151a and 153a are turned on.

In the read step, a read command is inputted and carried out. Herein, if the first connection block 151a is coupled to the first cell array 110 and the second connection block 153a is coupled to the second cell array 130, the sense amplifier 152a is coupled to the first cell array 110 when the first connection block 151a is activated and the second connection block 153a is inactivated. Otherwise, when the second connection block 153a is activated and the first connection block 151a is inactivated, the sense amplifier 152a is coupled to the second cell array 130 and disconnected to the first cell array 110.

In addition, a word line corresponding to an inputted address is activated by a supply voltage VDD or a high voltage VPP until the restore step.

Herein, for activating the word line, the high voltage VPP is generally used because it is requested that the supply voltage VDD becomes lower and an operating speed of the semiconductor memory device becomes faster.

If the word line is activated, a MOS transistor of the cell corresponding to the word line is turned on; and a data stored in a capacitor of the cell is delivered into the bit line BL.

Thus, the bit line BL precharged by the ½ core voltage is boosted up by a predetermined voltage level ΔV. Herein, though the capacitor is charged as the core voltage Vcore, a voltage level of the bit line BL cannot be increased to the core voltage Vcore because a capacitance Cc of the capacitor is smaller than a worm capacitance Cb of the bit line BL.

Referring to FIG. 5, in the read step, it is understood that a voltage level of the bit line BL is increased by the predetermined voltage level ΔV and the symbol 'SN' is also decreased to that voltage level.

At this time, i.e., when the data is delivered into the bit line BL, no data is delivered into the bit line bar /BL and, then, the bit line bar /BL keeps a ½ core voltage level.

Next, in the sense step, the first power supply signal SAP is supplied with the core voltage Vcore and the second power supply signal SAN is supplied with a ground GND. Then, the sense amplifier can amplify a voltage difference, i.e., a potential difference, between the bit line BL and the bit line bar /BL by using the first and the second power supply signals SAP and SAN. At this time, a relatively high side between the bit line BL and the bit line bar /BL is amplified to the core voltage Vcore; and the other side, i.e., a relatively low side between the bit line BL and the bit line bar /BL, is amplified to the ground GND.

Herein, a voltage level of the bit line BL is higher than that of the bit line bar /BL. That is, after the bit line BL and the bit line bar /BL are amplified, the bit line BL is supplied with the core voltage Vcore and the bit line bar /BL is supplied with the ground GND.

Lastly, in the restore step, the data outputted from the capacitor during the read step for boosting up the bit line BL by the predetermined voltage level ΔV is restored in the original capacitor. That is, the capacitor is re-charged. After the restore step, the word line corresponding to the capacitor is inactivated.

Then, the conventional semiconductor memory device carries out the precharge step again. Namely, the first and the second power supply signals SAP and SAN are respectively supplied with ½ core voltage Vcore. Also, the precharge signal BLEQ is activated and inputted to the first and the second equalization blocks 154a and 157a and the precharge block 155a. At this time, the sense amplifier 152a is coupled to the two neighbor cell arrays, e.g., 110 and 130, by the first and the second connection blocks 151a and 153a.

As a design technology for a semiconductor memory device is rapidly developed, a voltage level of a supply voltage for operating the semiconductor memory device becomes lower. However, though the voltage level of the supply voltage becomes lower, it is requested that an operation speed of the semiconductor memory device becomes faster.

For achieving the request about the operation speed of the semiconductor memory device, the semiconductor memory device includes an internal voltage generator for generating a core voltage Vcore having a lower voltage level than the supply voltage VDD and a high voltage VPP having a higher voltage level than the core voltage Vcore.

Until now, a requested operation speed can be achieved by implementing a nano-scale technology for manufacturing the semiconductor memory device through using above described manner for overcoming a decrease of the voltage level of the supply voltage VDD without any other particular method.

For example, through a voltage level of the supply voltage is decreased from about 3.3 V to about 2.5 V or under 2.5 V, the requested operation speed is achieved if the nano-scale technology is implemented based on from about 500 nm to about 100 nm. This means that the semiconductor memory device is more integrated. That is, as the nano-scale technology is upgraded, i.e., developed, a power consumption of a fabricated transistor included in the semiconductor memory device is reduced and, if the voltage level of the supply voltage is not decreased, an operation speed of the fabricated transistor becomes faster.

However, on the nano-technology based on under 100 nm, it is very difficult to develop the nano-technology. That is, there is a limitation for integrating the semiconductor memory device more and more.

Also, a requested voltage level of the supply voltage becomes lower, e.g., from about 2.0 V to about 1.5 V or so far as about 1.0 V. Thus, the request about the supply voltage cannot be achieved by only developing the nano-technology.

If a voltage level of the supply voltage inputted to the semiconductor memory device is lower than a predetermined voltage level, an operating margin of each transistor included in the semiconductor memory device is not sufficient; and, as a result, a requested operation speed is not satisfied and an operation reliability of the semiconductor memory device is not guaranteed.

Also, the sense amplifier needs more time for stably amplifying a voltage difference between the bit line BL and the bit line bar /BL because a predetermined turned-on voltage, i.e., a threshold voltage, of the transistor is remained under a low supply voltage.

Moreover, if a noise is generated at the bit line pair BL and /BL, each voltage level of the bit line BL and the bit line bar /BL is fluctuated, i.e., increased or decreased by a predetermined level on the ½ core voltage Vcore. That is, as the voltage level of the supply voltage becomes lower, a little noise can seriously affect the operation reliability of the semiconductor memory device.

Therefore, there is a limitation for decreasing a voltage level of the supply voltage under a predetermined level.

In addition, as the semiconductor memory device is more integrated, a size of the transistor becomes smaller and a distance between a gate of the transistor and the bit line gets near more and more. As a result, a bleed current is generated. Herein, the bleed current means a kind of leakage current between the gate of the transistor and the bit line because of a physical distance between the gate of the transistor and the bit line under a predetermined value.

FIG. 6 is a cross-sectional view describing an unit cell of the semiconductor memory device in order to show a cause of the bleed current.

As shown, the unit cell includes a substrate 10, an device isolation layer 11, source and drain regions 12a and 12b, a gate electrode 13, a bit line 17, a capacitor 14 to 16 and insulation layers 18 and 19. Herein, the symbol 'A' means a distance between the gate electrode 13 of the transistor and the bit line 17.

As it is rapidly developed the nano-technology for manufacturing the semiconductor memory device, the distance between the gate electrode 13 of the transistor and the bit line 17, i.e., 'A', becomes shorter.

In the precharge step, the bit line BL is supplied with the ½ core voltage and the gate electrode 13, i.e., a word line, is supplied with the ground.

If the bit line 17 and the gate electrode 13 in an unit cell are electronically short since an error is occurred under a manufacturing process, a current is flown continuously during the precharge step and a power consumption is increased. In this case, the semiconductor memory device includes a plurality of additional unit cells for substituting the unit cell where the bit line and the gate electrode are short electronically. At this time, error cells is substituted with additional cells in word line basis.

Otherwise, if there is no error under the manufacturing process, i.e., the bit line 17 and the gate electrode 13 in an unit cell are not electronically short in any cell of the semiconductor memory device, there is no bleed current. However, if the distance between the gate electrode 13 of the transistor and the bit line 17, i.e., 'A', is too short without any error under the manufacturing process, the bleed current is generated and flown.

Recently, how to operate a semiconductor memory device under a low power condition is very important. If above described bleed current is generated, it is not appreciate that the semiconductor memory device having the bleed current is applied to a system though the semiconductor memory device can be normally operated.

For reducing an amount of the bleed current, it is suggested that a resistor is added between the gate electrode of the transistor and the bit line. However, although the resistor can reduce little amount of the bleed current, this is not effective and essential for reducing and protecting a flow of the bleed current.

SUMMARY OF INVENTION

It is, therefore, an object of the present invention to provide a semiconductor device for operating in a fast speed under a low power condition and protecting a bleed current from generating to thereby reduce a power consumption.

In accordance with an aspect of the present invention, there is provided an apparatus included in a semiconductor memory device for precharging a bit line and a bit line bar and sensing and amplifying a data delivered to one of the bit line and the bit line bar, including: a precharge means for precharging the bit line and the bit line bar as a ground; a sense amplifying means for sensing and amplifying the data by using a low voltage having a lower voltage level than the ground and a high voltage having a higher voltage level than a supply voltage; and an auxiliary sense amplifying means coupled to the bit line and the bit line bar for controlling each voltage level of the bit line and the bit line bar.

In accordance with another aspect of the present invention, there is provided a method for precharging a bit line and a bit line bar and sensing and amplifying a data delivered to one of the bit line and the bit line bar in the semiconductor memory device, including the steps of: a) precharging the bit line and the bit line bar as a ground; b) sensing and amplifying the data by using a low voltage having a lower voltage level than the ground and a high voltage having a higher voltage level than a supply voltage; and c) maintaining a lower voltage level side between the bit line and the bit line bar as the ground while the data are sensed and amplified.

In accordance with another aspect of the present invention, there is provided a semiconductor memory device, including: a first cell array having a plurality of unit cells each for storing a data and outputting the data to one of a bit line and a bit line bar in response to inputted address and command; a precharge means for precharging the bit line and the bit line bar as a ground; a sense amplifying means for sensing and amplifying the data by using a low voltage having a lower voltage level than the ground and a high voltage having a higher voltage level than the core voltage; and an auxiliary sense amplifying means coupled to the bit line and the bit line bar for controlling each voltage level of the bit line and the bit line bar.

In accordance with another aspect of the present invention, there is provided a semiconductor memory device, including: a first cell array having a plurality of unit cells each for storing a data and outputting the data to one of a bit line and a bit line bar in response to inputted address and command; a first precharge block coupled to the first cell array for precharging the bit line or the bit line bar of the first cell array by using a ground; a second cell array having a plurality of unit cells each for storing a data and outputting the data to one of a bit line and a bit line bar in response to the inputted address and command; a second precharge block coupled to the second cell array for precharging the bit line or the bit line bar of the first cell array by using a ground; a sense amplifying block for sensing and amplifying the data outputted from one of the first and the second cell arrays by using a high voltage and a low voltage; an auxiliary sense amplifying means coupled to the bit line and the bit line bar for controlling each voltage level of the bit line and the bit line bar; a first connection control block located between the sense amplifying block and the first precharge block for connecting or disconnecting the sense amplifying block to the first precharge block; and a second connection control block located between the sense amplifying block and the first precharge block for connecting or disconnecting the sense amplifying block to the second precharge block.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device for operating under a low power condition according to the present invention will be described in detail referring to the accompanying drawings.

Figure 1:
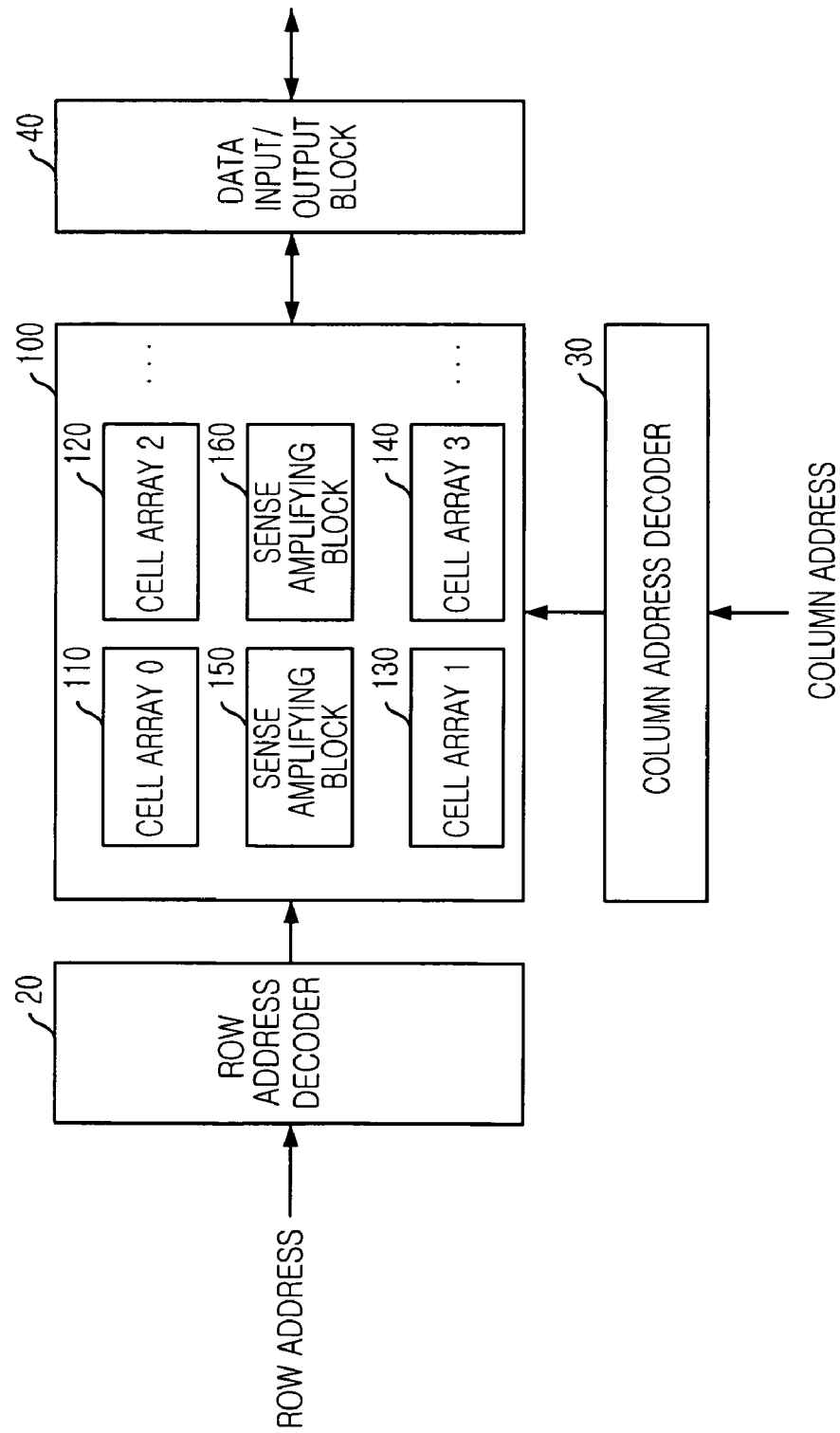
FIG. 1 is a block diagram showing a core area of a conventional semiconductor memory device.
Figure 2:
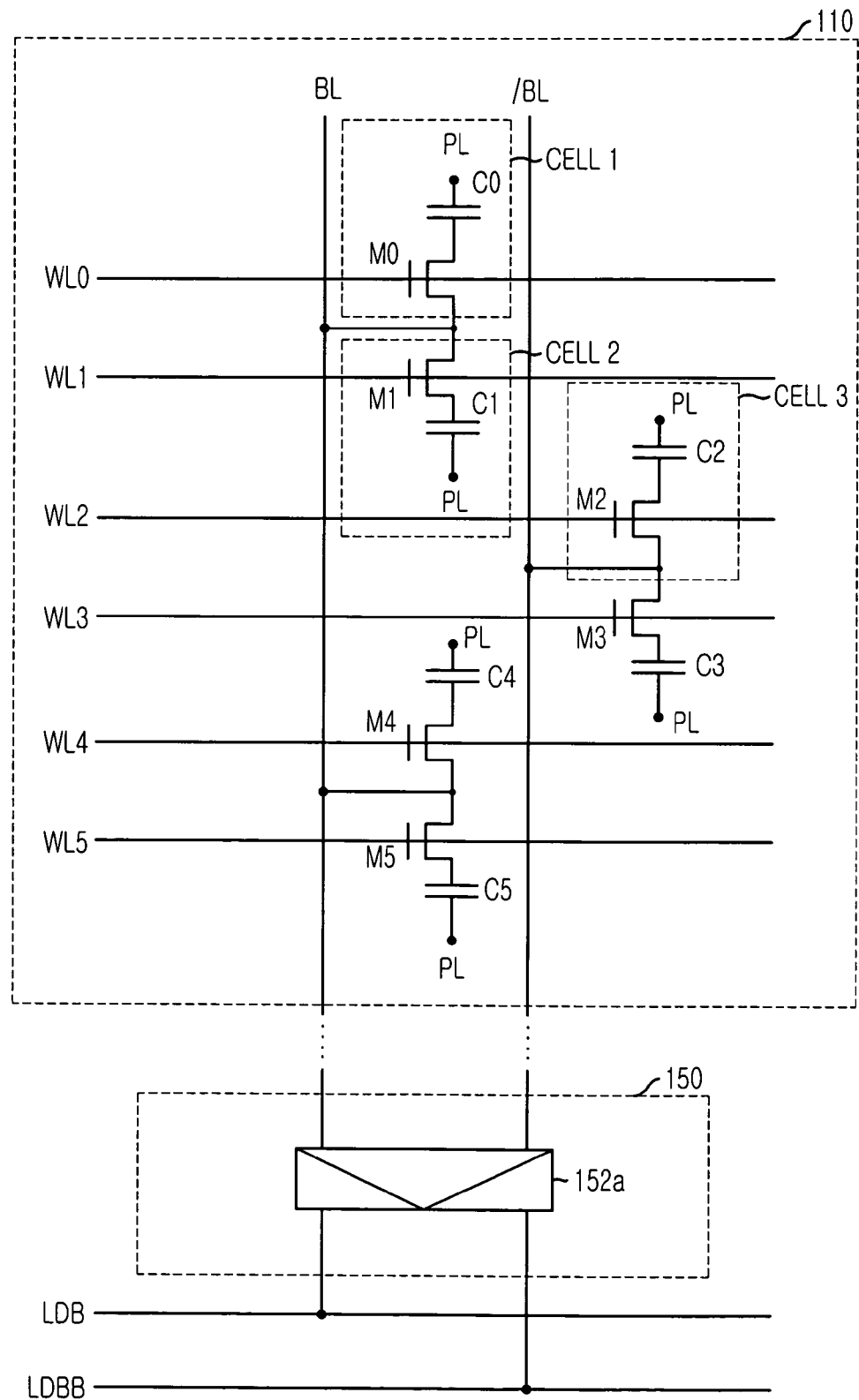
FIG. 2 is a block diagram depicting a detailed structure of the cell area shown in FIG. 1.
Figure 3:
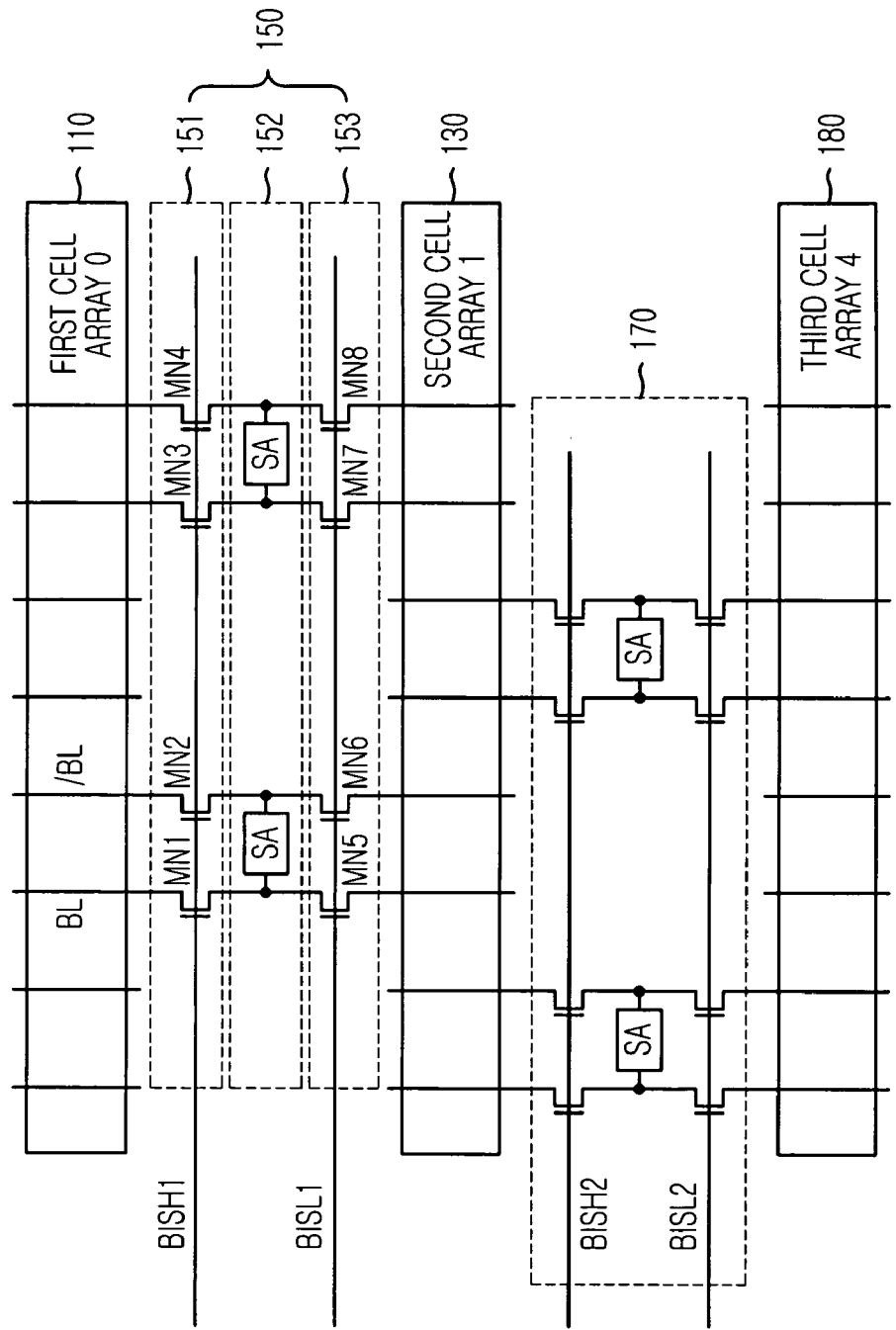
FIG. 3 is a block diagram describing a connection between each cell array and each sense amplifying block included in the cell area shown in FIG. 1.
Figure 4:
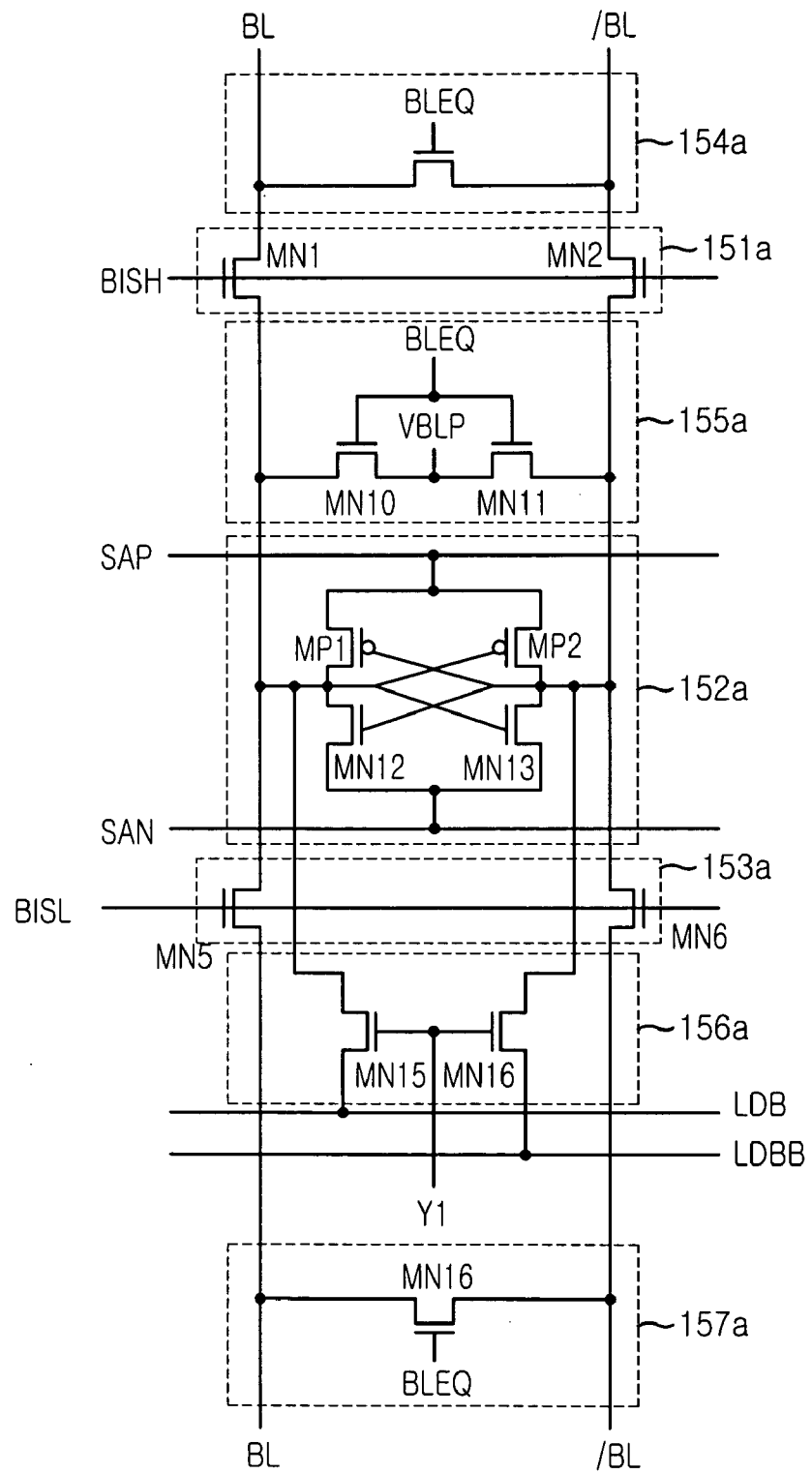
FIG. 4 is a block diagram depicting the sense amplifying block 150 shown in FIG. 2.
Figure 5:
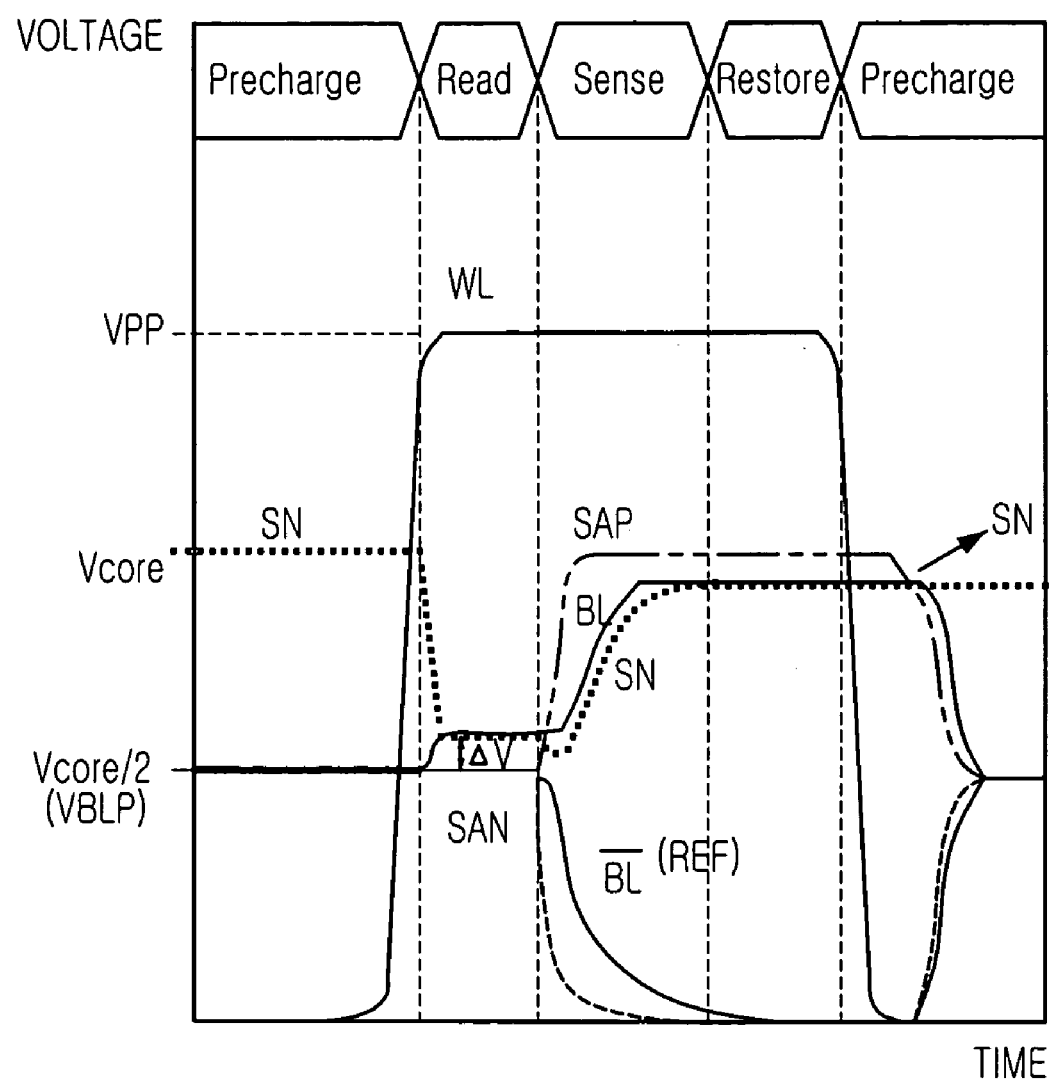
FIG. 5 is a waveform showing an operation of the conventional semiconductor memory device.
Figure 6:
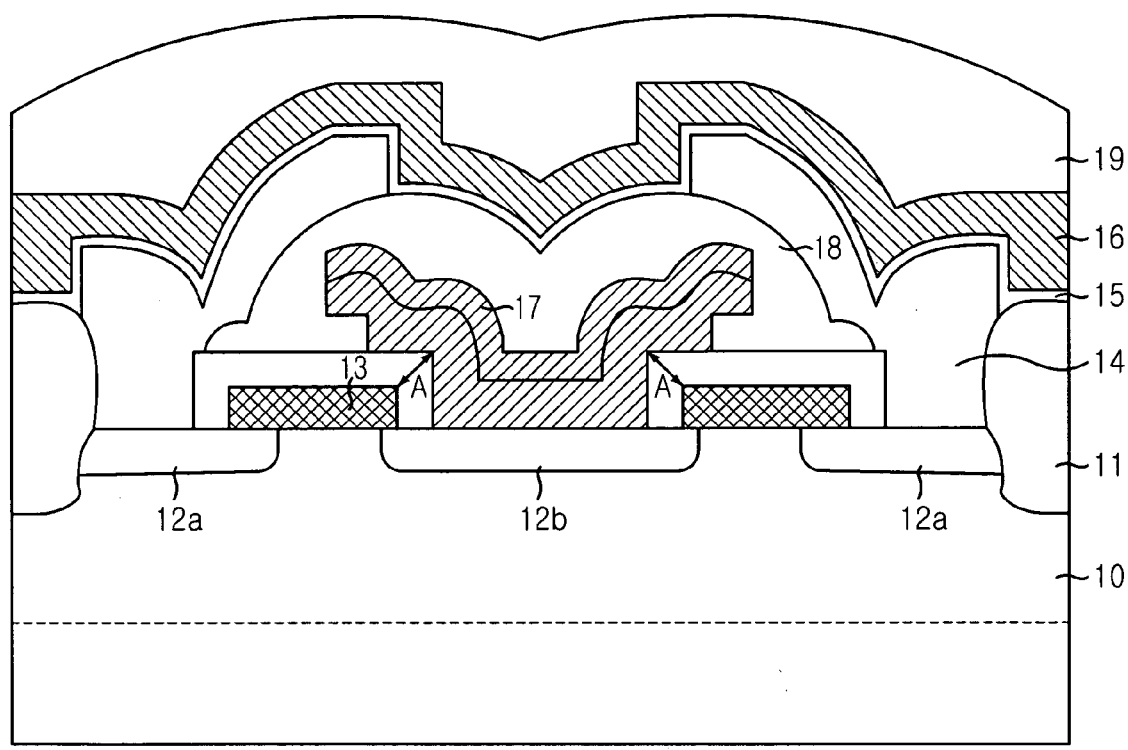
FIG. 6 is a cross-sectional view describing an unit cell of the semiconductor memory device in order to show a cause of the bleed current.
Figure 7:
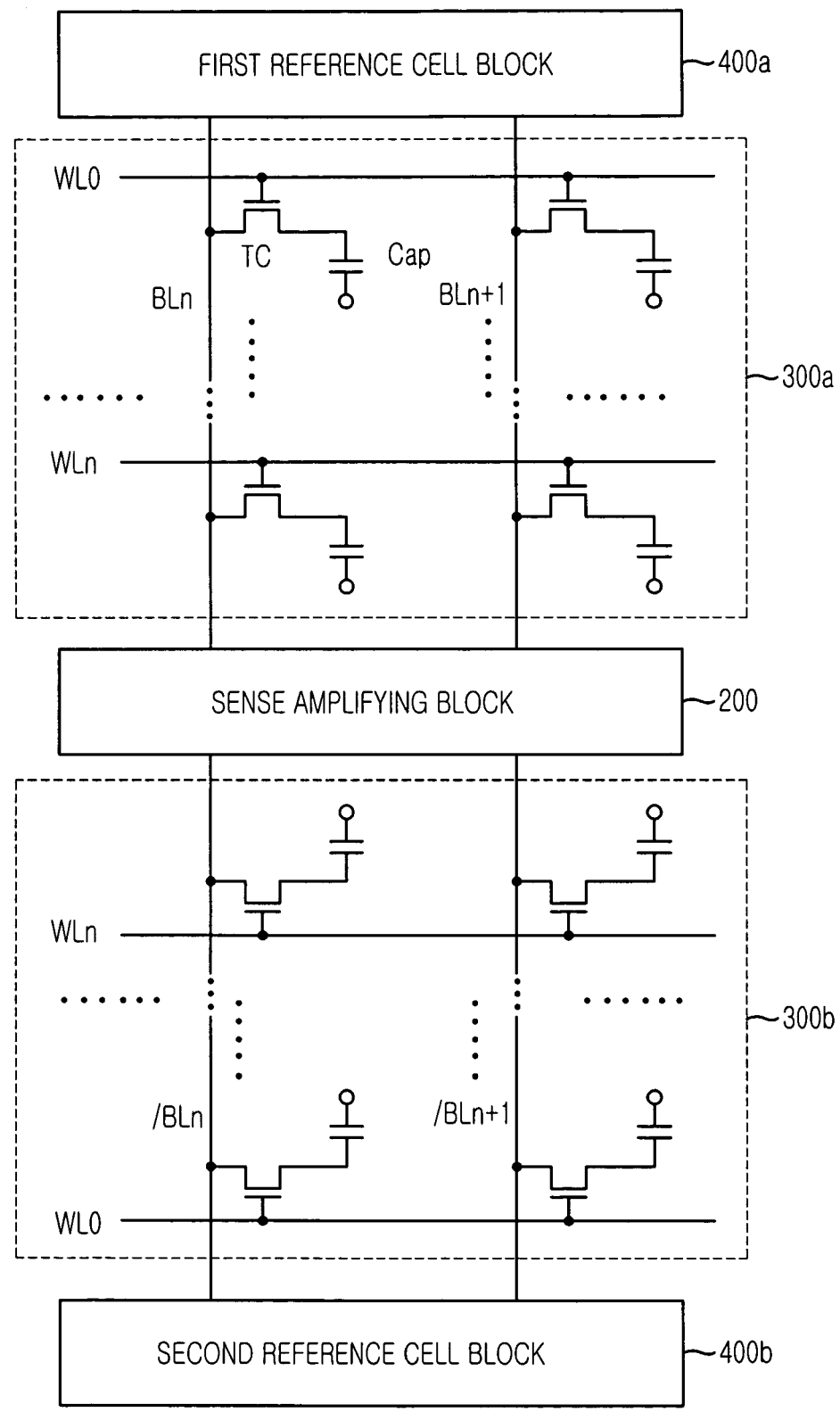
FIG. 7 is a block diagram showing a core area of a semiconductor memory device in accordance with an embodiment of the present invention.

FIG. 7 is a block diagram showing a core area of a semiconductor memory device in accordance with an embodiment of the present invention.

As shown, the semiconductor memory device includes a first reference cell block 400a, a second reference cell block 400b, a first cell array 300a, a second cell array 300b and a sense amplifying block 200.

Herein, each cell array, e.g., 400a, includes a plurality of unit cells, each for storing a data and outputting the data to one of a bit line and a bit line bar in response to inputted address and command; and the sense amplifying block 200 is for sensing and amplifying data outputted from each cell array. The first cell array 300a is coupled to the sense amplifying block 200 through a plurality of bit lines, e.g., BLn and BLn+1. The second cell array 300b is coupled to the sense amplifying block 200 through a plurality of bit line bars, e.g., /BLn and /BLn+1.

In detail, each unit cell included in the first and the second cell arrays 300a and 300b is constituted with one capacitor, e.g., Cap, and one transistor, e.g., TC.

The first and the second reference cell blocks 400a and 400b are for supplying a reference signal to the sense amplifying block 200 through the plurality of bit lines, e.g., BLn and BLn+1, and the plurality of bit line bars, e.g., /BLn and /BLn+1.

Figure 8:
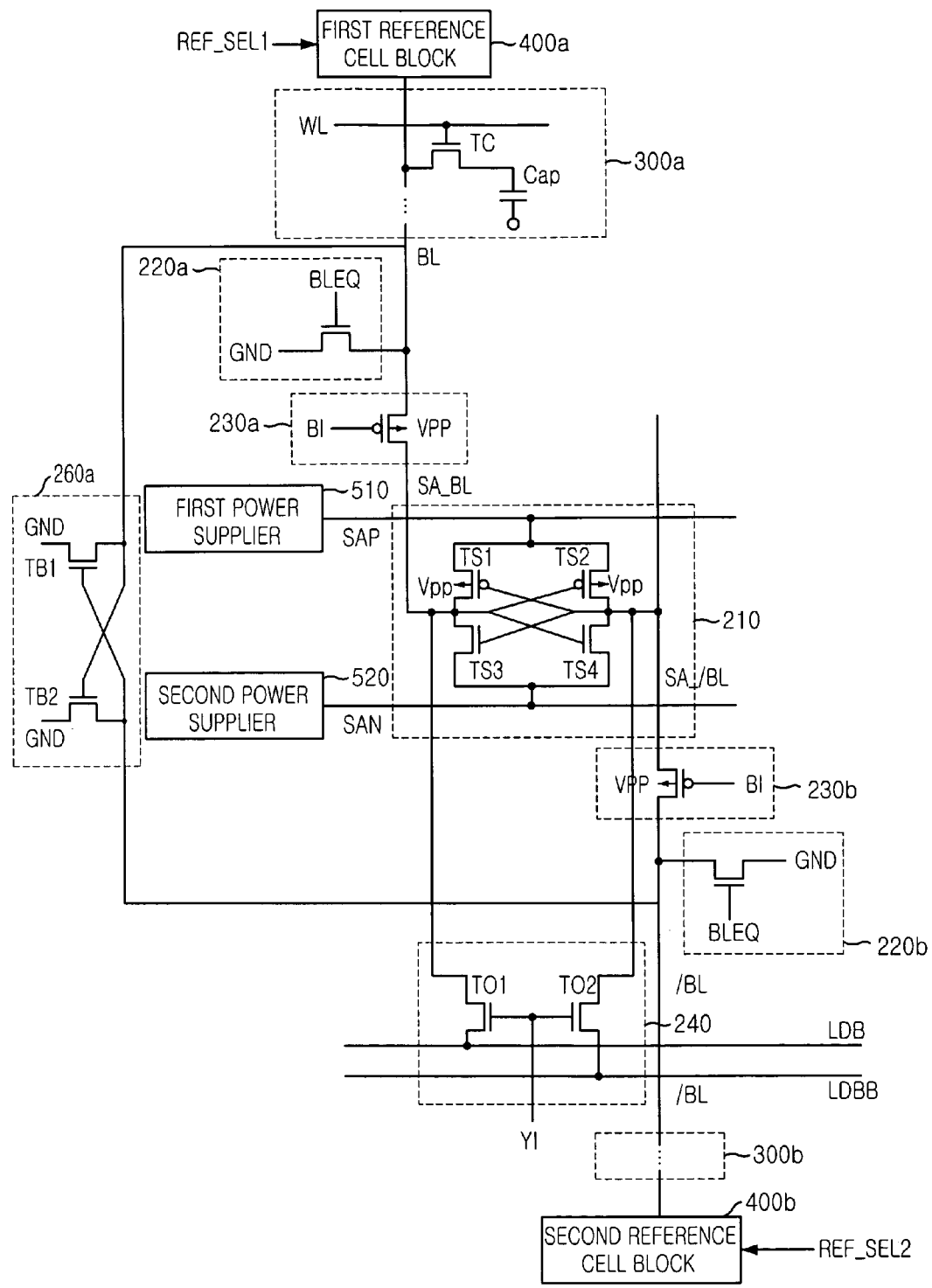
FIG. 8 is a first block diagram describing a sense amplifying block shown in FIG. 7.

FIG. 8 is a first block diagram describing the sense amplifying block 200 shown in FIG. 7.

As shown, the sense amplifying block 200 includes a precharge block 220a and 220b, a connection control block 230a and 230b, a sense amplifier 210, a data output block 240 and an auxiliary sense amplifier 260a. In the semiconductor memory device shown in FIG. 7, two neighbor cell arrays, i.e., 300a and 300b are coupled to one sense amplifying block 200.

As shown, an unit cell included in the first cell array 300a is coupled to the sense amplifier 210 through a bit line BL and an unit cell included in the second cell array 300b is coupled to the sense amplifier 210 through a bit line bar /BL. Herein, there are a first precharge block 220a and a first connection control block 230a located between the first cell array 300a and the sense amplifier 210. Likewise, there are a second precharge block 220b and a second connection control block 230b located between the second cell array 300b and the sense amplifier 210.

The sense amplifier 210 receives a first power supply signal SAP and a second power supply signal SAN for amplifying a potential difference, i.e., a voltage difference, between the bit line BL and the bit line bar /BL. When the sense amplifier 210 is activated, a high voltage VPP is inputted as the first power supply signal SAP and a low voltage VBB is inputted as the second power supply signal SAN. If the sense amplifier 210 is inactivated, a ground GND is inputted as the first and the second power supply signals SAP and SAN.

Herein, the high voltage VPP has a higher voltage level than a supply voltage VDD inputted from an external circuit; and the low voltage VBB has a lower voltage level than the ground GND.

Enabled by a precharge signal BLEQ when the sense amplifier 210 is not activated, the first and the second precharge blocks 220a and 220b are for respectively precharging the bit line BL and the bit line bar /BL as the ground GND. Lastly, the data output block 240 outputs a data amplified by the sense amplifier 210 to a local data line pair, i.e., LDB and LDBB, based on an inputted column address.

Namely, the precharge block 220 is for precharging the bit line BL and the bit line bar /BL as a ground GND; and the sense amplifying block 210 senses and amplifies a data by using the high voltage VPP and the low voltage VBB. That is, the high voltage VPP and the low voltage VBB is respectively inputted as the first power supply signal SAP and the second power supply signal SAN.

Furthermore, the sense amplifying block 210 includes the first and the second connection blocks 230a and 230b, each for delivering a data loaded in the bit line or the bit line bar into the sense amplifying block and preventing the low voltage VBB from delivering into the bit line and the bit line bar respectively coupled to the cell array.

For example, if a data stored in the first cell array 300a is outputted through the bit line BL in response to an inputted command, the first connection control block 230a is activated. As a result, the data can be delivered to the sense amplifier 210. And then, in order to prevent the low voltage from supplying to the bit line BL connected to the first cell array 300a, the first connection control block 230a is inactivated while the sense amplifier senses and amplifiers a voltage difference between the bit line BL and the bit line bar /BL. Likewise, if a data stored in the second cell array 300b is outputted through the bit line bar /BL in response to an inputted command, the second connection control block 230b is activated. As a result, the data can be delivered to the sense amplifier 210. And then, in order to prevent the low voltage from supplying to the bit line bar /BL connected to the second cell array 300a, the second connection control block 230b is inactivated while the sense amplifier senses and amplifiers a voltage difference between the bit line BL and the bit line bar /BL.

That is, while the sense amplifier 210 performs the sense amplifying operation, one of a sense amplifier coupled bit line SA_BL and a sense amplifier coupled bit line bar SA_/BL is decreased to the low voltage level. Herein, the sense amplifier coupled bit line SA_BL is a bit line connected between the first connection control block 230a and the sense amplifier 210 and the sense amplifier coupled bit line bar SA_/BL is a bit line bar connected between the second connection control block 230b and the sense amplifier 210. Under assumption that the sense amplifier coupled bit line bar SA_/BL is decreased to the low voltage level, the bit line bar /BL should not be decreased to the low voltage level. For this purpose, the second connection control block 203b prevents the low voltage VBB from being supplied to the bit line bar /BL, whereby the bit line bar /BL stays in the ground voltage level.

Furthermore, the auxiliary sense amplifier 260a is coupled to the bit line BL and the bit line bar /BL for one of the bit line BL and the bit line bar /BL to be more stably stay in the ground voltage level while the sense amplifier 210 performs the sense amplifying operation. That is, since the first and the second connection control blocks 230a and 230b cannot stably maintain the bit line BL and the bit line bar /BL as the ground voltage level, the auxiliary sense amplifier 260a is provided.

Moreover, in the semiconductor memory device according to the present invention, the first reference cell block 400a supplies a reference signal to the bit line BL when the second cell array 300b outputs a data to the sense amplifier 210 through the bit line bar /BL. Likewise, the second reference cell block 400b supplies the reference signal to the bit line bar /BL when the first cell array 300a outputs a data to the sense amplifier 210 through the bit line BL.

Each of the first and the second precharge blocks 220a and 220b includes a transistor for supplying the ground GND to the bit line BL and the bit line bar /BL as the precharge voltage in response to the precharge signal BLEQ. When a precharge operation is carried out, i.e., the precharge signal BLEQ is activated, the first and the second connection control blocks 230a and 230b are also activated in response to a control signal BI.

The sense amplifying block 210 includes a first and a second PMOS transistors TS1 and TS2 and a first and a second NMOS transistors TS3 and TS4.

The first PMOS transistor TS1 has a gate, a drain and a source, the gate coupled to the bit line bar /BL, the source for receiving the first power supply signal SAP and the drain coupled to the bit line BL. And, the second PMOS transistor TS2 has a gate, a drain and a source, the gate coupled to the bit line /BL, the source for receiving the first power supply signal SAP and the drain coupled to the bit line bar /BL.

The first NMOS transistor TS3 has a gate, a drain and a source, the gate coupled to the bit line bar /BL, the source for receiving the second power supply signal SAN and the drain coupled to the bit line BL; and the second NMOS transistor TS4 has a gate, a drain and a source, the gate coupled to the bit line BL, the source for receiving the second power supply signal SAN and the drain coupled to the bit line bar /BL.

After amplified by the sense amplifier 210, the data is transmitted to a local data line LDB and a local data line bar LDBB through the data output block 240.

The data output block 240 is for delivering the data amplified by the sense amplifying block 210 into a local data line LDB and a local data line bar LDBB or delivering an inputted data through the local data line LDB and the local data line bar LDBB into the sense amplifying block 210.

In detail, the data output block 240 includes a first and a second MOS transistors TO1 and TO2. The first MOS transistor TO1 is coupled between the bit line BL and the local data line LDB for delivering a data amplified by the sense amplifier 210 into the local data line LDB or delivering an inputted data through the local data line LDB into the sense amplifying block 210 in response to a column control signal YI based on an inputted column address. Also, the second MOS transistor TO2 is coupled between the bit line bar /BL and the local data line bar LDBB for delivering a data amplified by the sense amplifier 210 into the local data line bar LDBB or delivering an inputted data through the local data line bar LDBB into the sense amplifying block 210 in response to the column control signal YI.

The auxiliary sense amplifier 260a includes a third MOS transistor TB1 one end of which is connected to the bit line BL and the other end of which is connected to the ground GND; and a second MOS transistor TB2 one end of which is connected to the bit line bar /BL and the other end of which is connected to the ground GND. Herein, a gate of the third MOS transistor TB1 is coupled to the one end of the fourth MOS transistor TB2 and a gate of the fourth MOS transistor TB2 is coupled to the one end of the third MOS transistor TB1.

Figure 9:
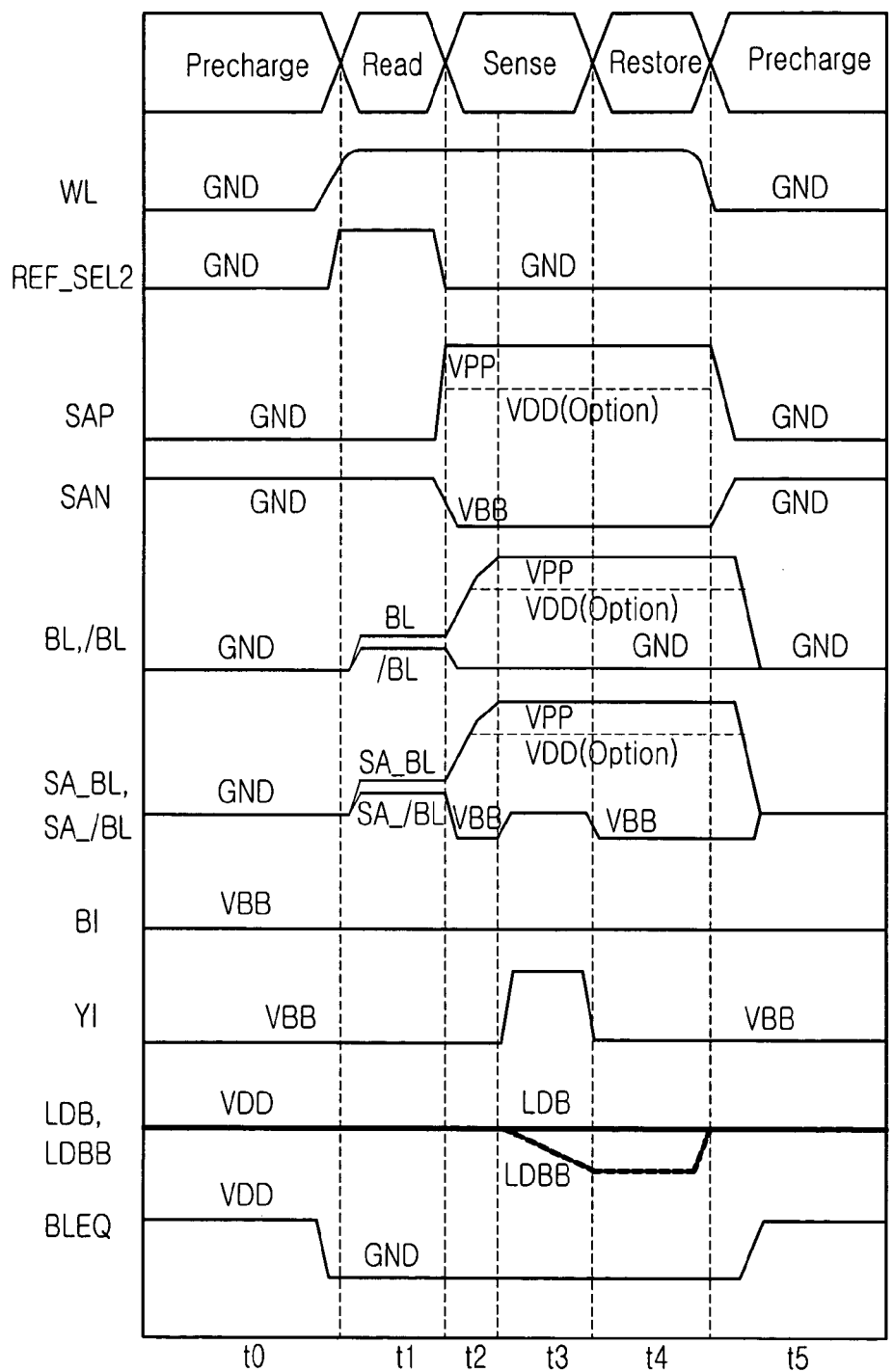
FIGS. 9 to 11 are waveform diagrams showing operations of the semiconductor memory device shown in FIG. 7.
Figure 10:
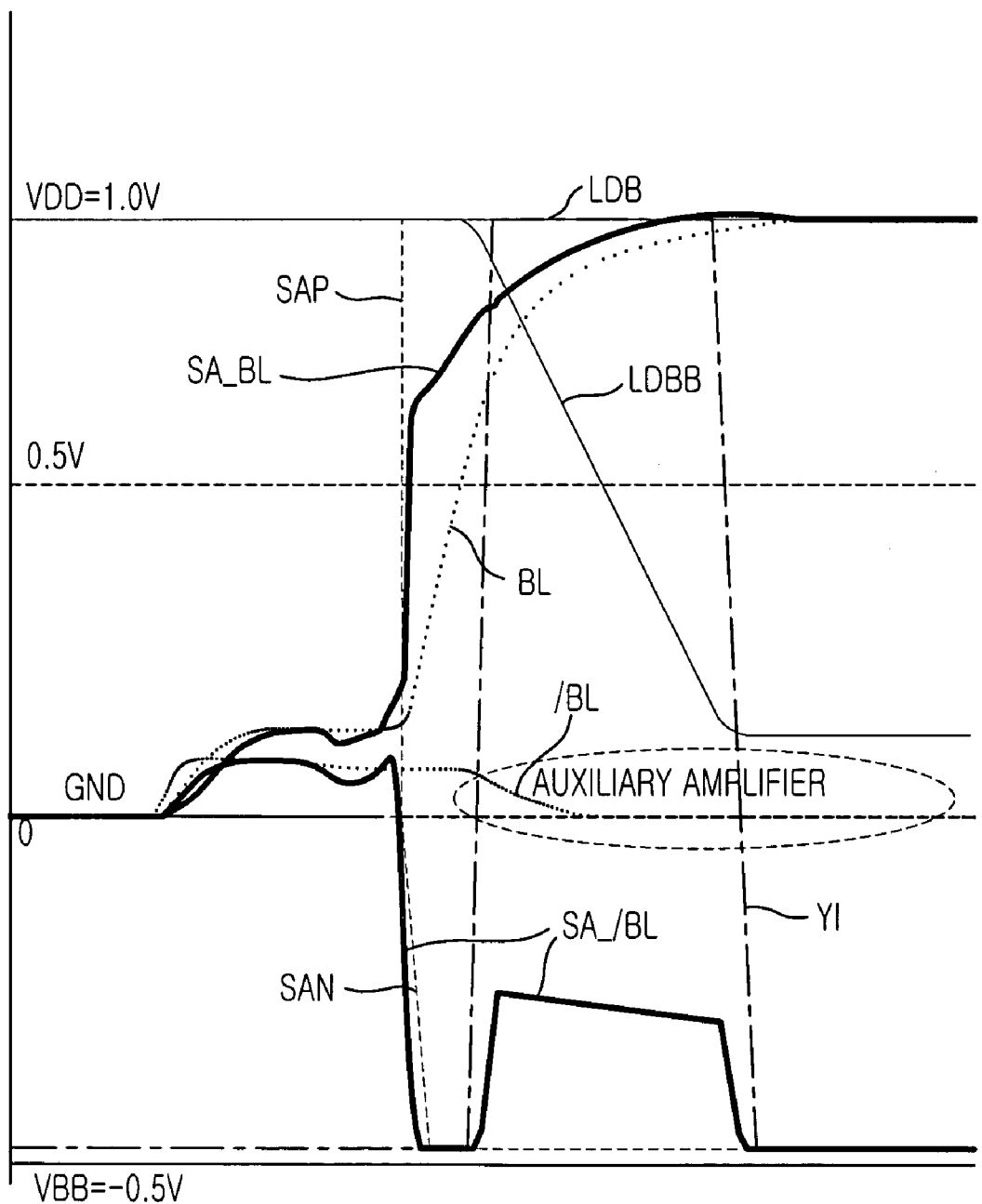
Figure 11:
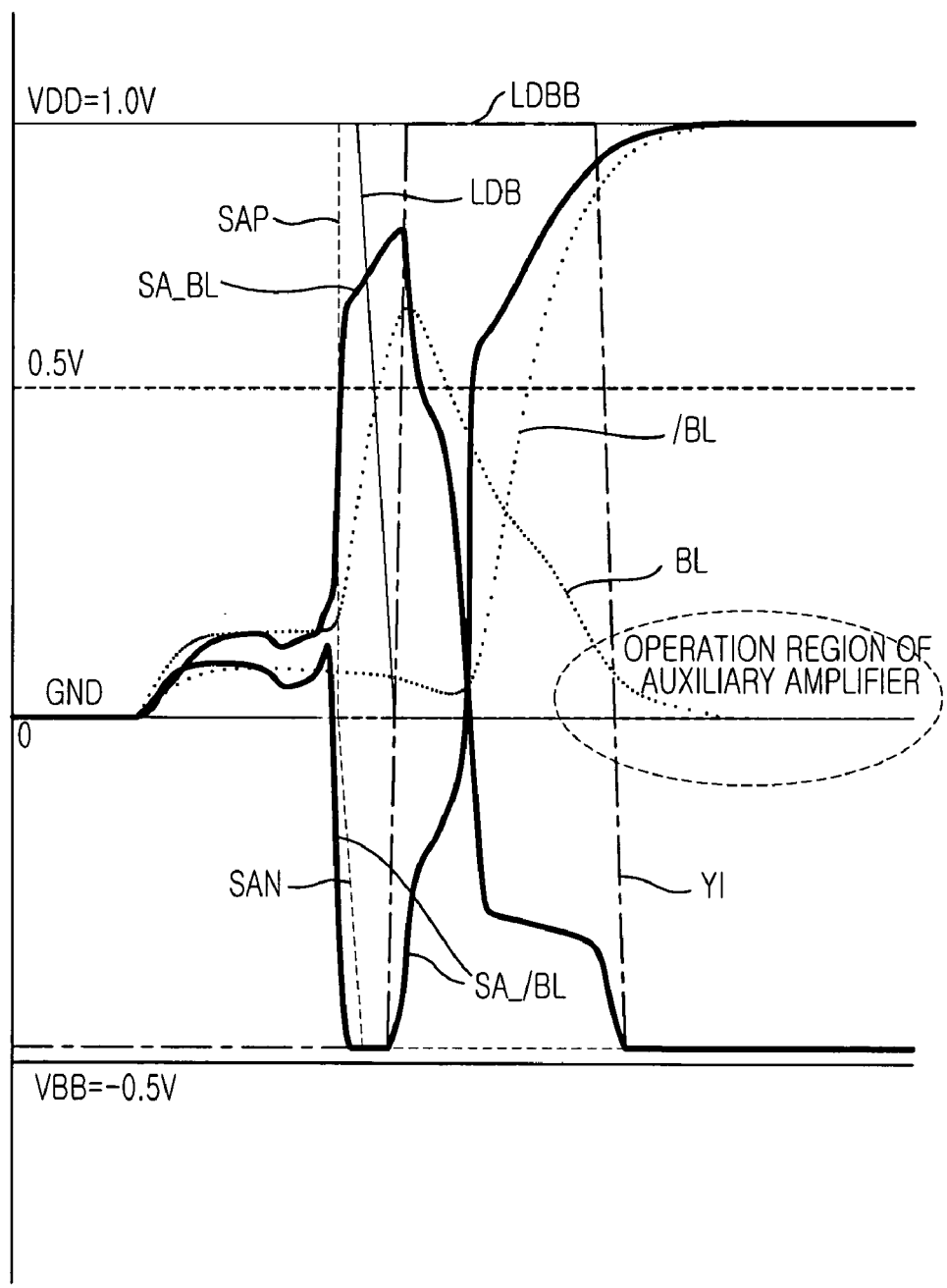

FIGS. 9 to 11 are waveform diagrams showing operations of the semiconductor memory device shown in FIG. 7.

Referring to FIGS. 7 to 11, the operations of the semiconductor memory device in accordance with the present invention are described below.

As above described, the read operation can be split into four steps: a precharge step t0, a read step t1, a sense step t2 and t3 and a restore step t4. Likewise, a write operation is very similar to the read operation. However, the write operation includes a write step instead of the read step in the read operation and, more minutely, not a sensed and amplified data is not outputted but an inputted data from an external circuit is latched in the sense amplifier during the sense step. Further, the sense step includes a first sense step t2 and a second sense step t3. The data output block 240 is activated during the second sense step t3 because an amplified data is not stable during the first sense step t2.

Hereinafter, it is assumed that a capacitor of a cell included in the first cell array 300a coupled to the bit line BL is charged, i.e., stores a logic high data "1".

Particularly, the bit line BL and the bit line bar /BL in the semiconductor memory device according to the present invention are precharged as the ground GND. Also, referring to FIG. 7, the semiconductor memory device has an open bit line structure.

In the precharge step t0, the bit line BL and the bit line bar /BL are precharged as the ground GND instead of a bit line precharge voltage VBLP generally being a ½ core voltage, i.e., ½ Vcore=VBLP. At this time, all word lines are inactivated. Namely, if the precharge signal BLEQ activated as a logic high level is kept during the precharge step t0, the bit line BL and the bit line bar /BL are precharged as the ground GND.

In the read step ti, a read command is inputted and carried out and then a word line WL corresponding to an inputted address is activated by a supply voltage VDD or a high voltage VPP until the restore step.

Herein, for activating the word line, the high voltage VPP is generally used because it is requested that the supply voltage VDD becomes lower and an operating speed of the semiconductor memory device becomes faster.

If the word line WL is activated, a MOS transistor of the cell corresponding to the word line is turned on; and a data stored in a capacitor of the cell included in the first cell array 300a is delivered into the bit line BL. At this time, the precharge signal BLEQ inputted to the precharge block 220 is inactivated.

Meanwhile, when the first cell array 300a outputs the stored data to the bit line BL, the second reference cell block 400b coupled to the bit line bar /BL outputs the reference signal having ½ voltage level of the data stored in the capacitor of the cell to the bit line bar /BL in response to a second reference control signal REF_SEL2.

Otherwise, when the second cell array 300b outputs a stored data to the bit line bar /BL, the first reference cell block 400a coupled to the bit line BL outputs the reference signal having ½ voltage level of the data stored in the capacitor of the cell included in the second cell array 300b into the bit line BL in response to a first reference control signal REF_SEL1.

Referring to FIG. 9, in the read step, it is understood that each voltage level of the bit line BL and the bit line bar /BL is increased by each predetermined voltage level, e.g. about twice voltage level.

Next, in the sense step t2 and t3 of the sense step, the first power supply signal SAP is supplied with the high voltage VPP and the second power supply signal SAN is supplied with the low voltage VBB.

In the first sense step t2, the sense amplifier 210 can amplify a voltage difference, i.e., a potential difference, between the bit line BL and the bit line bar /BL by using the first and the second power supply signals SAP and SAN. At this time, a relatively high side between the bit line BL and the bit line bar /BL is amplified to the high voltage VPP; and the other side, i.e., a relatively low side between the bit line BL and the bit line bar /BL, is amplified to the ground GND. Then, the amplified voltage difference is latched in the sense amplifier 210. Particularly, the sense amplifier can amplify a voltage difference faster than the conventional sense amplifier because the high voltage VPP and the low voltage VBB are used instead of the supply voltage VDD and the ground GND.

Herein, a voltage level of the bit line BL is higher than that of the bit line bar /BL. That is, after the bit line BL and the bit line bar /BL are amplified, the bit line BL keeps a voltage level of the high voltage VPP. However, the bit line bar /BL keeps a voltage level of the ground GND through the bit bar /BL can be temporary amplified to the low voltage VBB because the second connection control blocks 230*b* is inactivated, i.e., turned off. That is, since the bit line bar /BL is precharged as the ground GND having higher voltage level than the low voltage VBB, the bit line bar /BL in the sense amplifier 210 is not amplified to the low voltage VBB. As a result, a voltage level of the bit line BL in the first cell array 300*a* can be kept as the ground GND.

Herein, the first and the second connection control blocks are for preventing the low voltage VBB from delivering into the bit line bar /BL in the second cell array 300*b*.

In addition, since a worm capacitance generated by the bit line BL in the second cell array 300*b* is relatively larger, amount of current flowing a transistor included the second connection control block 230*b* is a little. Thus, a voltage level of the bit line bar /BL in the second cell array 300*b* can kept as the ground GND during the sense step t2 and t3 and the restore step t4.

Likewise, in the case when the bit line BL is amplified to the low voltage VBB, the first connection control block 230*a* is inactivated in order to prevent the low voltage VBB from being delivered into the bit line BL in the first cell array 300*a*.

If the low voltage VBB is delivered into the bit line BL or the bit line bar /BL in the first or the second cell array 300*a* or 300*b*, a data sensed from the first or the second cell array 300*a* or 300*b* is destroyed, i.e., a charge loaded in the bit line BL or the bit line bar /BL is discharged. Thus, it is prevented that the low voltage VBB is transmitted to the first or the second cell array 300*a* or 300*b* through the first or the second connection control block 230*a* or 230*b*.

That is, the low voltage VBB is used for increasing an operation speed of the sense amplifier 210 but prohibited from being transmitted to the first and the second cell arrays 300*a* and 300*b*.

Herein, as above-mentioned, the auxiliary sense amplifier 260*a* is provided for stably maintaining the bit line BL or the bit line bar /BL as the ground voltage level.

That is, during the sense step, the auxiliary sense amplifier 260*a* detects a voltage difference between the bit line BL and the bit line bar /BL, then controls one of the bit line BL and the bit line bar /BL which has a lower voltage level than the other to stay in the ground voltage level.

In case that the sense amplifier coupled bit line bar SA_/BL is amplified to the low voltage VBB, the bit line bar /BL in the second cell array 300*b* becomes the ground voltage level. At this time, for stably maintaining the bit line bar /BL as the ground voltage level, the auxiliary sense amplifier 260*a* increases a voltage level of the bit line bar /BL if the voltage level of the bit line bar /BL is lower than the ground GND or decreases the voltage level of the bit line bar /BL if the voltage level of the bit line bar /BL is higher than the ground GND.

As above-mentioned, each one end of the third and the fourth MOS transistors TB1 and TB2 is coupled to the ground GND for supplying the ground GND to one of the bit line BL and the bit line bar /BL.

FIG. 10 is a waveform diagram showing the above-mentioned operations of the auxiliary sense amplifier 260*a* when the semiconductor memory device performs the read operation. As shown, the bit line bar /BL is rapidly changed to the ground GND and is stably kept as the ground GND by the auxiliary sense amplifier 260*a*.

FIG. 11 is another waveform diagram showing the above-mentioned operations of the auxiliary sense amplifier 260*a* when the semiconductor memory device performs the write operation. As shown, the bit line BL is rapidly changed to the ground GND and is stably kept as the ground GND by the auxiliary sense amplifier 260*a*.

Particularly, in FIG. 11, it is shown that the sense amplifier coupled bit line SA_BL is amplified to the high voltage level and the sense amplifier coupled bit line bar SA_/BL is amplified to the low voltage level, then the bit line BL is amplified to the low voltage level and the bit line bar /BL is amplified to the high voltage level according to a logic level of a data inputted to be written. At this time, as shown, the bit line BL is changed to the ground GND and is stably kept as the ground GND by the auxiliary sense amplifier 260*a*.

During the second sense step t3 after the first sense step t2, the sense amplifier 210 continuously receives the first and the second power supply signals SAP and SAN and, then, a voltage level of the bit line BL is stabilized as the high voltage VPP. Also, an I/O control signal Yi based on an inputted column address is activated as a logic high level. In response to the activated I/O control signal Yi, the data output block 240 delivers each voltage level, i.e., data, loaded at the bit line BL and the bit line bar /BL into the local data line LDB and the local data line bar LDBB.

Herein, the local data line LDB and the local data line bar LDBB are precharged with a ½ core voltage Vcore when any data is not delivered. Then, when the data is delivered into the local data line LDB and the local data line bar LDBB, a voltage level of the local data line bar LDBB is temporary decreased to the ground GND since the voltage level of the bit line bar /BL is the ground GND.

Lastly, in the restore step t4, the data outputted from the capacitor during the read step for boosting up the bit line BL by the predetermined voltage level is restored in the original capacitor. That is, the capacitor is re-charged. After the restore step t4, the word line WL corresponding to the capacitor is inactivated.

After the restore step, the ground GND is supplied to the sense amplifier 210 as the first and the second power supply signals SAP and SAN.

In the conventional semiconductor memory device, since the local data line LDB and the local data line bar LDBB are precharged as the supply voltage VDD or a ½ supply voltage ½ VDD when any data is transmitted through the the local data line LDB and the local data line bar LDBB, a voltage level of the bit line bar /BL amplified to the ground GND by the sense amplifier 210 is increased to a predetermined level by the data output block 240.

Thus, for recovering the predetermined level of the bit line bar /BL to the ground GND, the conventional semiconductor memory device has an enough time for the restore step. Otherwise, in the restore step, a fault data can be restored in the original cell of the first or the second cell array 300a or 300b. For example, when an original data is "0", a restore data can become "1". Therefore, in the conventional semiconductor memory device, it takes an enough time, i.e., relatively long time, to perform the restore step t4.

However, the bit line bar /BL in the sense amplifier 210 is amplified to the low voltage VBB having a lower voltage level than the ground GND in the present invention. Thus, because of the low voltage VBB, a voltage level of the bit line bar /BL is little increased if the supply voltage VDD or the half supply voltage, i.e., ½ VDD, is supplied to the bit line bar /BL in the sense amplifier 210.

Therefore, in the semiconductor memory device according to the present invention, a period of the restore step t4 can be reduced.

Then, the semiconductor memory device performs a precharge step t5 again. Also, the precharge signal BLEQ is activated and inputted to the precharge block 220. At this time, the sense amplifier 210 is coupled to the two neighbor cell arrays, i.e., 300a and 300b. As a result, the bit line BL and the bit line bar /BL are precharged as the ground GND.

Hereinafter, it is assumed that a capacitor of a cell included in the first cell array 300a coupled to the bit line BL is charged, i.e., stores a logic low data "0".

Likewise, in the precharge step t0, the bit line BL and the bit line bar /BL are precharged as the ground GND.

In the read step t1, a read command is inputted and carried out and then a word line WL corresponding to an inputted address is activated by a supply voltage VDD or a high voltage VPP until the restore step.

If the word line WL is activated, a MOS transistor of the cell corresponding to the word line is turned on; and a data stored in a capacitor of the cell included in the first cell array 300a is delivered into the bit line BL. At this time, the precharge signal BLEQ inputted to the precharge block 220 is inactivated. However, since the data is a logic low level "0", a voltage level of the bit line BL is not changed, i.e., maintained as the ground GND.

Meanwhile, when the first cell array 300a outputs the stored data to the bit line BL, the second reference cell block 400b coupled to the bit line bar /BL outputs the reference signal having ½ voltage level of the data stored in the capacitor of the cell to the bit line bar /BL in response to a second reference control signal REF_SEL2.

Next, in the first sense step t2 of the sense step, the first power supply signal SAP is supplied with the high voltage VPP and the second power supply signal SAN is supplied with the low voltage VBB. Then, the sense amplifier 210 can amplify a voltage difference, i.e., a potential difference, between the bit line BL and the bit line bar /BL by using the first and the second power supply signals SAP and SAN, i.e., the high voltage VPP and the low voltage VBB. At this time, a relatively high side between the bit line BL and the bit line bar /BL is amplified to the high voltage VPP; and the other side, i.e., a relatively low side between the bit line BL and the bit line bar /BL, is amplified to the ground GND.

Herein, the first and the second connection control blocks are for preventing the low voltage VBB from delivering into the bit line BL in the first cell array 300a. As a result, the bit line BL can keep a voltage level as the ground GND because the first connection control block 230a is inactivated, i.e., turned off.

Since other steps for sensing and amplifying a logic low data, i.e., "0", are the same to those of a logic high data, i.e., "1", description of those steps is omitted herein.

Continuously, the write operation of the semiconductor memory device according to the present invention is described. The write operation receives a write command, an address and a data from an external circuit. Then, the data is inputted to the local data line LDB and the local data line bar LDBB. In the sense step, a sensed and amplified data of the sense amplifier 210 is not outputted but the inputted data from an external circuit is latched in the sense amplifier 210. Herein, the sense step also includes the first and the second sense steps t2 and t3 using the high voltage VPP and the low voltage VBB in order to increase an operation speed of the sense amplifier 210. Then, in the second sense step t3, an inputted data is transmitted and latched to the sense amplifier 210 through the data output block 240 in response to the column control signal YI.

Next, in the restore step t4, the data latched in the sense amplifier 210 during the sense step is stored in the capacitor corresponding to the inputted address.

As above described, in the read operation and the write operation, the bit line BL and the bit line bar /BL are precharged as the ground GND and the sense amplifier 210 uses the high voltage VPP and the low voltage VBB for sensing and amplifying a data stored in a cell or latching an inputted data of the local data line and the local data line pair.

As a result, i.e., since the sense amplifier 210 is supplied with the high voltage VPP, the operation speed of the semiconductor memory device according to the present invention is increased, i.e., improved. Also, it can be difficult to boost up a voltage level of the bit line BL or the bit line bar /BL to a predetermined voltage level since the bit line BL and the bit line bar /BL are precharged as the ground GND; however, the sense amplifier 210 can effectively amplify the voltage level by using the high voltage VPP and the low voltage VBB.

Based on a ground level precharge operation as above described, advantages about the semiconductor memory device according to the present invention are expected.

First of all, an operation margin of the sense amplifier is improved dramatically.

If the bit line and the bit line bar are precharged as a ½ core voltage, the sense amplifier amplifies each voltage level of the bit line and the bit line bar to the ground or the core voltage. For instance, if the core voltage is about 1.5 V, the sense amplifier amplifies about 0.75 V, i.e., ½ core voltage, to about 0 V or about 1.5 V. Herein, the voltage level of the core voltage is in proportion with a voltage level of the supply voltage which is inputted to the semiconductor memory device from an external circuit.

If the core voltage is about 5 V, it is not difficult operation that about 2.5 V is increased to about 5 V or decreased to about 0 V. However, if the core voltage is about 1.5 V or under 1.5 V, it is difficult to stably operate the sense amplifier in response to a noise or an interference. That is, if a noise is occurred in the semiconductor memory device after a data is loaded to one of the bit line and the bit line bar when the bit line and the bit line bar are precharged as about 0.75 V, the sense amplifier cannot sense a voltage difference between the bit line and the bit line bar. Thus, after amplified by the sense amplifier, each voltage level of the bit line and the bit line bar can be reversed.

However, in the present invention, the bit line and the bit line bar are precharged as the ground. Thus, though the core voltage is about 1.5 V, the sense amplifier can amplify each voltage level of the bit line and the bit line bar to the core voltage Vcore or the ground by using a voltage difference because of reducing disadvantage of the noise. Namely, in the semiconductor memory device according to the present invention, the sense amplifier can stably sense and amplify the data under a low core voltage, i.e., when the supply voltage inputted to the semiconductor memory device is low.

Secondly, in the semiconductor memory device according to the present invention, a bleed current generated between a word line, i.e., a gate of a transistor in each cell, and a bit line is protected. When the bit line and the bit line bar is precharged as the ground and the word line is inactivated, any current cannot be flown because there is no voltage difference between one of the bit line and the bit line bar and the inactivated word line. Thus, a power consumption of the semiconductor memory device can be reduced.

Thirdly, in the semiconductor memory device according to the present invention, an operation speed is improved because the sense amplifier is operated by using the high voltage VPP and the low voltage VBB although the voltage level of the supply voltage becomes lower.

Fourthly, the semiconductor memory device according to the present invention can reduce the period of the restore step t4. In the conventional semiconductor memory device, since the local data line LDB and the local data line bar LDBB are precharged as the supply voltage VDD or a ½ supply voltage ½ VDD when any data is transmitted through the the local data line LDB and the local data line bar LDBB, a voltage level of the bit line bar /BL amplified to the ground GND by the sense amplifier 210 is increased to a predetermined level by the supply voltage VDD or the ½ supply voltage ½ VDD. However, the bit line bar /BL in the sense amplifier 210 is amplified to the low voltage VBB having a lower voltage level than the ground GND in the present invention. Thus, because of the low voltage VBB, a voltage level of the bit line bar /BL is little increased if the supply voltage VDD or the half supply voltage, i.e., ½ VDD, is supplied to the bit line bar /BL in the sense amplifier 210.

Lastly, in accordance with the present invention, a data of unselected cell can be protected since the auxiliary sense amplifier 260*a* maintains the bit line BL or the bit line bar /BL as the ground GND as described above.

Figure 12:
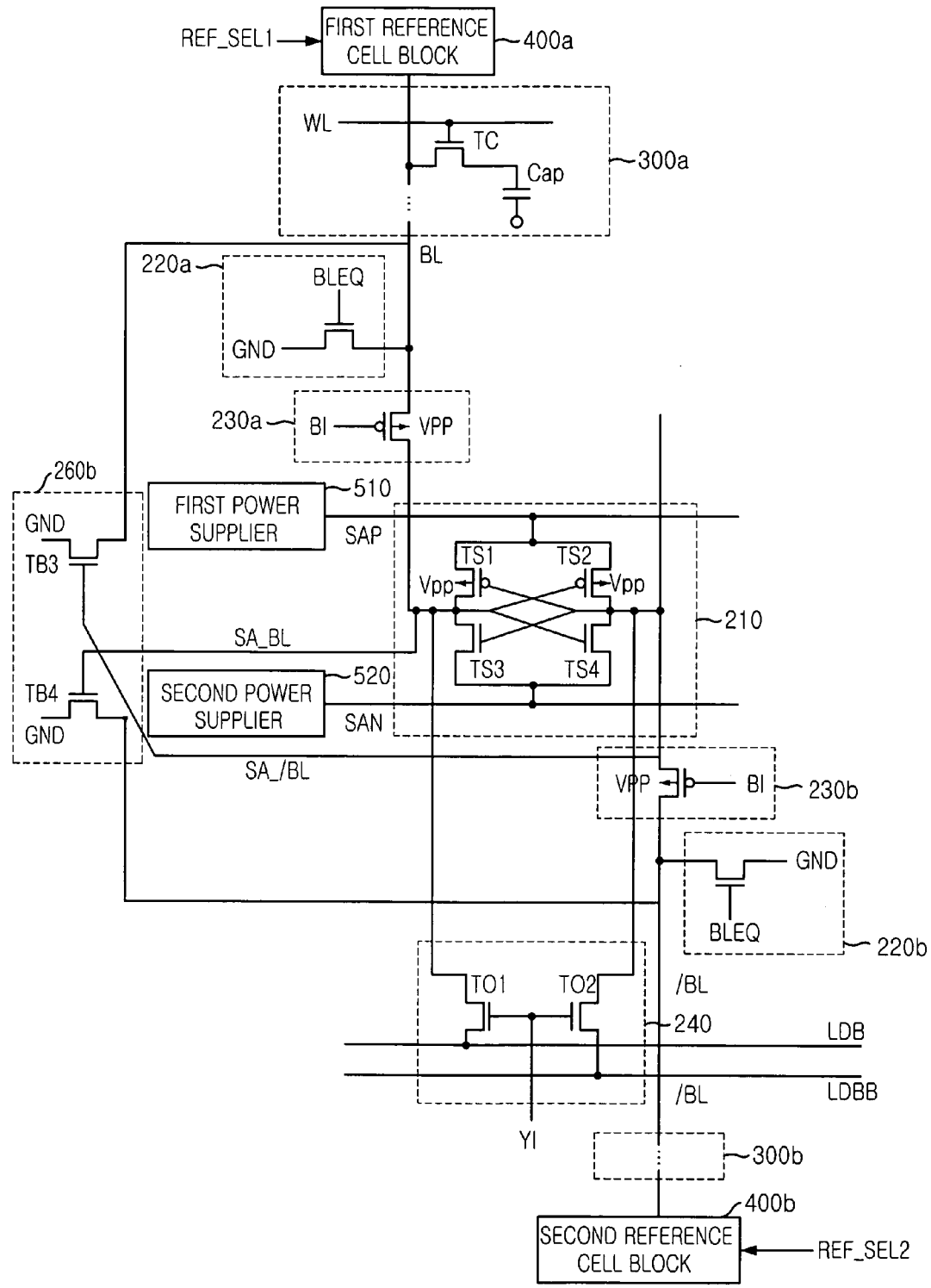
FIG. 12 is a second block diagram describing the sense amplifying block shown in FIG. 7.

FIG. 12 is a second block diagram describing the sense amplifying block 200 shown in FIG. 7.

In comparison with the amplifying block 200 shown in FIG. 8, an auxiliary sense amplifier 260*b* is differently configured. That is, the auxiliary sense amplifier 260*b* includes a fifth MOS transistor TB3 one end of which is connected to the ground and the other end of which is connected to the bit line BL; and a sixth MOS transistor TB4 one end of which is connected to the ground GND and the other end of which is connected to the bit line bar /BL. Herein, a gate of the fifth MOS transistor TB3 is connected to the sense amplifier coupled bit line bar SA_/BL and a gate of the sixth MOS transistor TB4 is connected to the sense amplifier coupled bit line SA_BL. Operations of the auxiliary sense amplifier 260*b* is same to the operations of the auxiliary sense amplifier 260*a* shown in FIG. 8.

Figure 13:
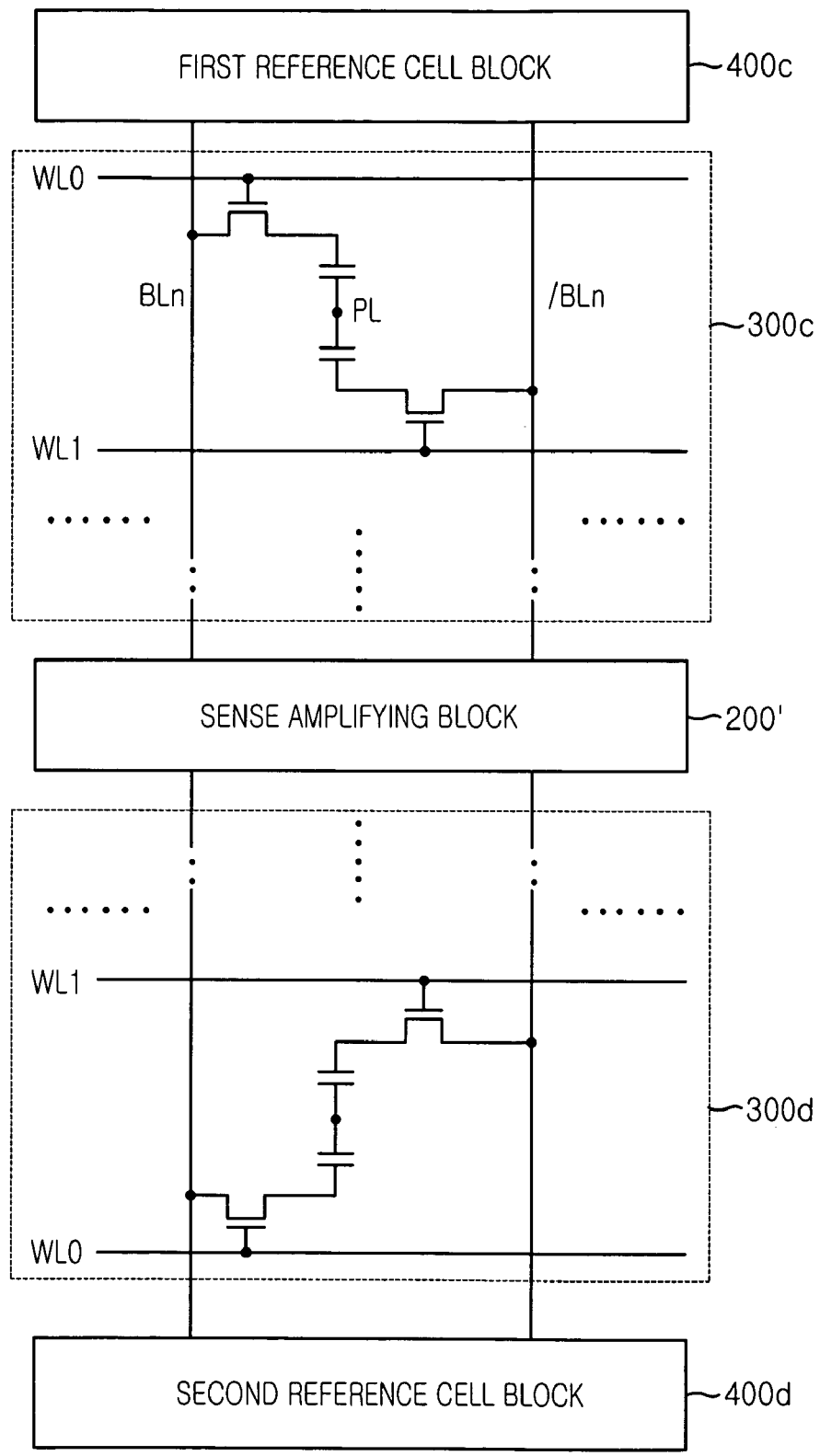
FIG. 13 is a block diagram showing a core area of a semiconductor memory device in accordance with another embodiment of the present invention.

FIG. 13 is a block diagram showing a core area of a semiconductor memory device in accordance with another embodiment of the present invention.

As shown, the semiconductor memory device includes a first reference cell block 400*c*, a second reference cell block 400*d*, a first cell array 300*c*, a second cell array 300*d* and a sense amplifying block 200'.

Herein, each cell array, e.g., 400*c*, includes a plurality of unit cells, each for storing a data and outputting the data to one of a bit line and a bit line bar in response to inputted address and command; and the sense amplifying block 200' is for sensing and amplifying data outputted from each cell array. The first cell array 300*c* is coupled to the sense amplifying block 200' through a plurality of bit line pairs, e.g., BLn and /BLn. The second cell array 300*d* is coupled to the sense amplifying block 200' through a plurality of bit line pairs.

The first and the second reference cell blocks 400*c* and 400*d* are for supplying a reference signal to the sense amplifying block 200' through the plurality of bit line pairs, e.g., BLn and /BL.

As compared with the semiconductor memory device shown in FIG. 7, each cell array of the semiconductor memory device shown in FIG. 13 is coupled to the sense amplifying block 200' through the plurality of bit line pairs. Also, a location and a connection between two neighbor unit cells are different. That is, referring to FIG. 7, two neighbor unit cells are commonly coupled to one word line. However, as shown in FIG. 10, two neighbor unit cells are commonly coupled to one plate line PL, not one word line.

Figure 14:
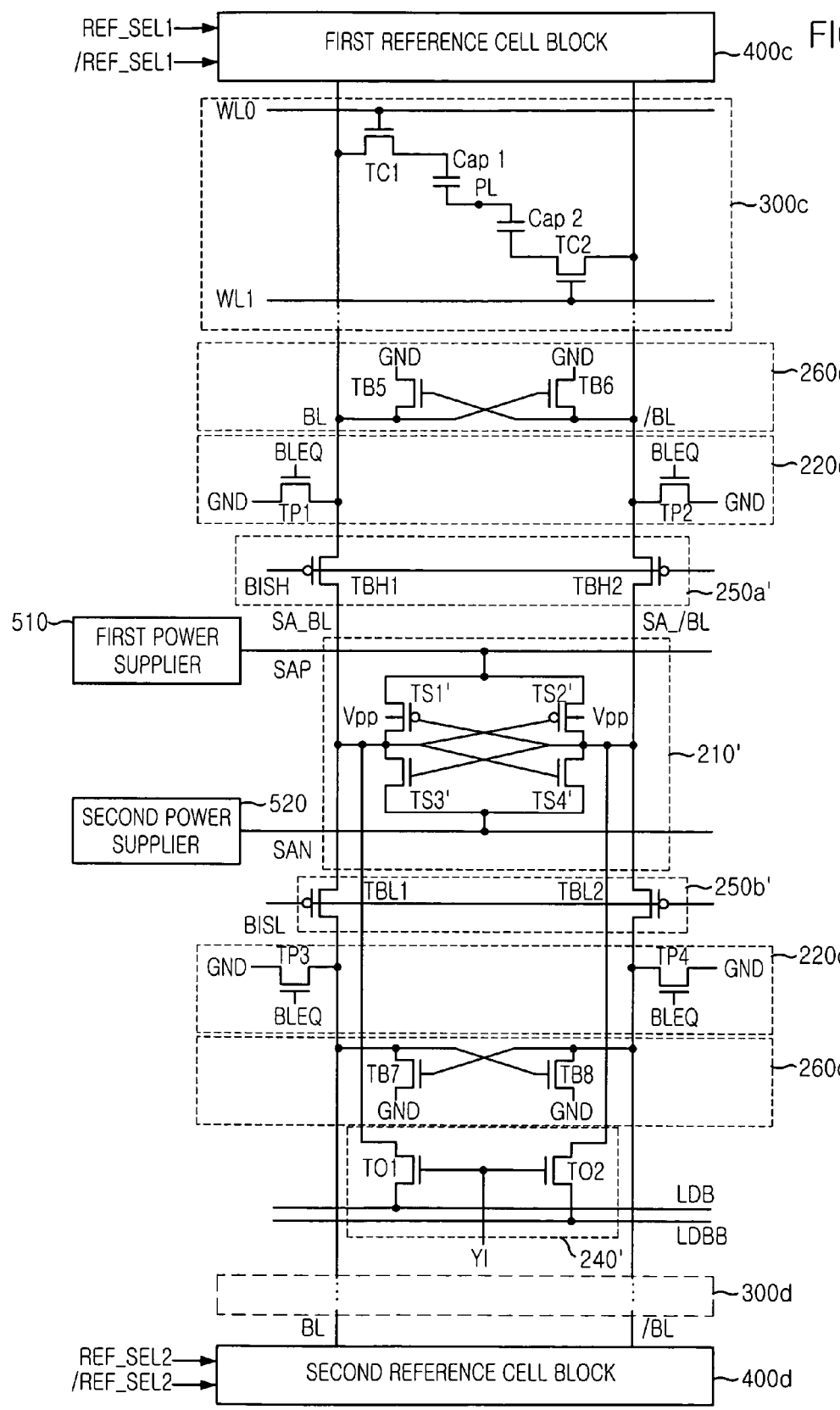
FIG. 14 is a first block diagram minutely describing the core area of the semiconductor memory device shown in FIG. 13.

FIG. 14 is a first block diagram minutely describing the core area of the semiconductor memory device shown in FIG. 13.

As shown, the sense amplifying block 200' includes a precharge block 220', a sense amplifier 210', a data output block 240' and an auxiliary sense amplifying block 260'. In the semiconductor memory device shown in FIG. 13, two neighbor cell arrays, i.e., 300*c* and 300*d*, are coupled to one sense amplifying block 200'.

Further, the sense amplifying block 200' includes a first connection control block 250*a'* and a second connection control block 250*b'* for connecting or disconnecting one of the two neighbor cell arrays, i.e., 300*c* and 300*d*, and one of the two reference cell array, i.e., 400*c* and 400*d*, to the sense amplifier 210' through the bit line BL and the bit line bar /BL. Herein, the first and second power suppliers 510 and 520 are the same to those shown in FIG. 8.

Meanwhile, the auxiliary sense amplifying block 260' includes a first auxiliary sense amplifier 260*c'* and a second auxiliary sense amplifier 260*d'* for maintaining lower voltage level side between the bit line BL and the bit line bar /BL as the ground GND while the sense amplifying operation is performed.

The first auxiliary sense amplifier 260*c'* includes a third NMOS transistor TB5 one end of which is coupled to the ground GND and the other end of which is coupled to the bit line BL; and a fourth NMOS transistor TB6 one end of which is coupled to the ground GND and the other end of which is coupled to the bit line bar /BL. Herein, a gate of the third NMOS transistor TB5 is coupled to the bit line bar /BL, and a gate of the fourth NMOS transistor TB6 is coupled to the bit line BL.

As shown, if an unit cell included in the first cell array 300*c* is coupled to the sense amplifier 210' through a bit line BL, i.e., a data stored in the first cell array 300*c* is outputted to the sense amplifier 210', the first reference cell block 400*c* outputs a reference signal to the sense amplifier 210' through a bit line bar /BL. Otherwise, if an unit cell included in the second cell array 300*d* is coupled to the sense amplifier 210' through a bit line bar /BL, the second reference cell block 400*d* outputs a reference signal to the sense amplifier 210' through a bit line BL.

That is, in the semiconductor memory device according to the present invention, the first reference cell block 400*c* supplies a reference signal to one of the bit line BL and the bit line bar /BL when the first cell array 300*c* outputs a data to the sense amplifier 210' through the other of the bit line BL and the bit line bar /BL. At this time, the first connection control block 250*a'* is activated, i.e., all transistors, e.g., TBH1, are turned on in response to a first connection control signal BISH during the read step t1. In addition, during the sense step t2 and t3 after the read step t1, the first connection control block 250a' is inactivated for preventing a data from being destroyed. Further, the first auxiliary sense amplifier 260c' stably maintains one of the bit line BL and the bit line bar /BL as the ground GND.

Likewise, the second reference cell block 400d supplies the reference signal to one of the bit line BL and the bit line bar /BL when the second cell array 300d outputs a data to the sense amplifier 210 through the other of the bit line BL and the bit line bar /BL. At this time, the second connection control block 250b' are activated, i.e., all transistors, e.g., TBL1, are turned on in response to a second connection control signal BISL during the read step t1.

The sense amplifier 210' receives the high voltage VPP as the first power supply signal SAP and the ground GND as the second power supply signal SAN for amplifying a potential difference between the bit line BL and the bit line bar /BL. Enabled by a precharge signal BLEQ when the sense amplifier 210' is not activated, the precharge block 220' is for precharging the bit line BL and the bit line bar /BL as the ground GND.

Lastly, the data output block 240' outputs a data amplified by the sense amplifier 210' to a local data line pair, i.e., LDB and LDBB, based on an inputted column address.

Herein, the precharge block 220' is for precharging the bit line BL and the bit line bar /BL as a ground GND; and the sense amplifying block 210' senses and amplifies a data by using the high voltage VPP having a higher voltage level than the power supply voltage VDD and the low voltage VBB having a lower voltage level than the ground GND. That is, the high voltage VPP and the low voltage VBB are respectively inputted as the first and the second power supply signals SAP and SAN.

The precharge block 220' includes a first and a second transistors TP1' and TP2'. The first transistor TP1' receives a precharge signal BLEQ and supplies the ground GND to the bit line BL as the precharge voltage in response to the precharge signal BLEQ. Also, the second transistor TP2' is for receiving the precharge signal BLEQ and supplying the ground GND to the bit line bar /BL as the precharge voltage in response to the precharge signal BLEQ.

The sense amplifying block 210' includes a first and a second PMOS transistors TS1' and TS2' and a first and a second NMOS transistors TS3' and TS4'.

The first PMOS transistor TS1' has a gate, a drain and a source, the gate coupled to the bit line bar /BL, the source for receiving one of the core voltage Vcore and the high voltage VPP as the power supply signal SAP and the drain coupled to the bit line BL. And, the second PMOS transistor TS2' has a gate, a drain and a source, the gate coupled to the bit line /BL, the source for receiving one of the core voltage Vcore and the high voltage VPP as the power supply signal SAP and the drain coupled to the bit line bar /BL.

The first NMOS transistor TS3' has a gate, a drain and a source, the gate coupled to the bit line bar /BL, the source for receiving the ground GND and the drain coupled to the bit line BL; and the second NMOS transistor TS4' has a gate, a drain and a source, the gate coupled to the bit line BL, the source for receiving the ground GND and the drain coupled to the bit line bar /BL.

After amplified by the sense amplifier 210', the data is transmitted to a local data line LDB and a local data line bar LDBB through the data output block 240'.

The data output block 240' is for delivering the data amplified by the sense amplifying block 210' into a local data line LDB and a local data line bar LDBB or delivering an inputted data through the local data line LDB and the local data line bar LDBB into the sense amplifying block 210'.

In detail, the data output block 240' includes a first and a second MOS transistors TO1' and TO2'. The first MOS transistor TO1' is coupled between the bit line BL and the data line LDB for delivering a data loaded in the bit line BL and amplified by the sense amplifier 210' into the local data line LDB. Also, the second MOS transistor TO2' is coupled between the bit line bar /BL and the local data line bar LDBB for delivering a data loaded in the bit line bar /BL and amplified by the sense amplifier 210' into the local data line bar LDBB.

Figure 15:
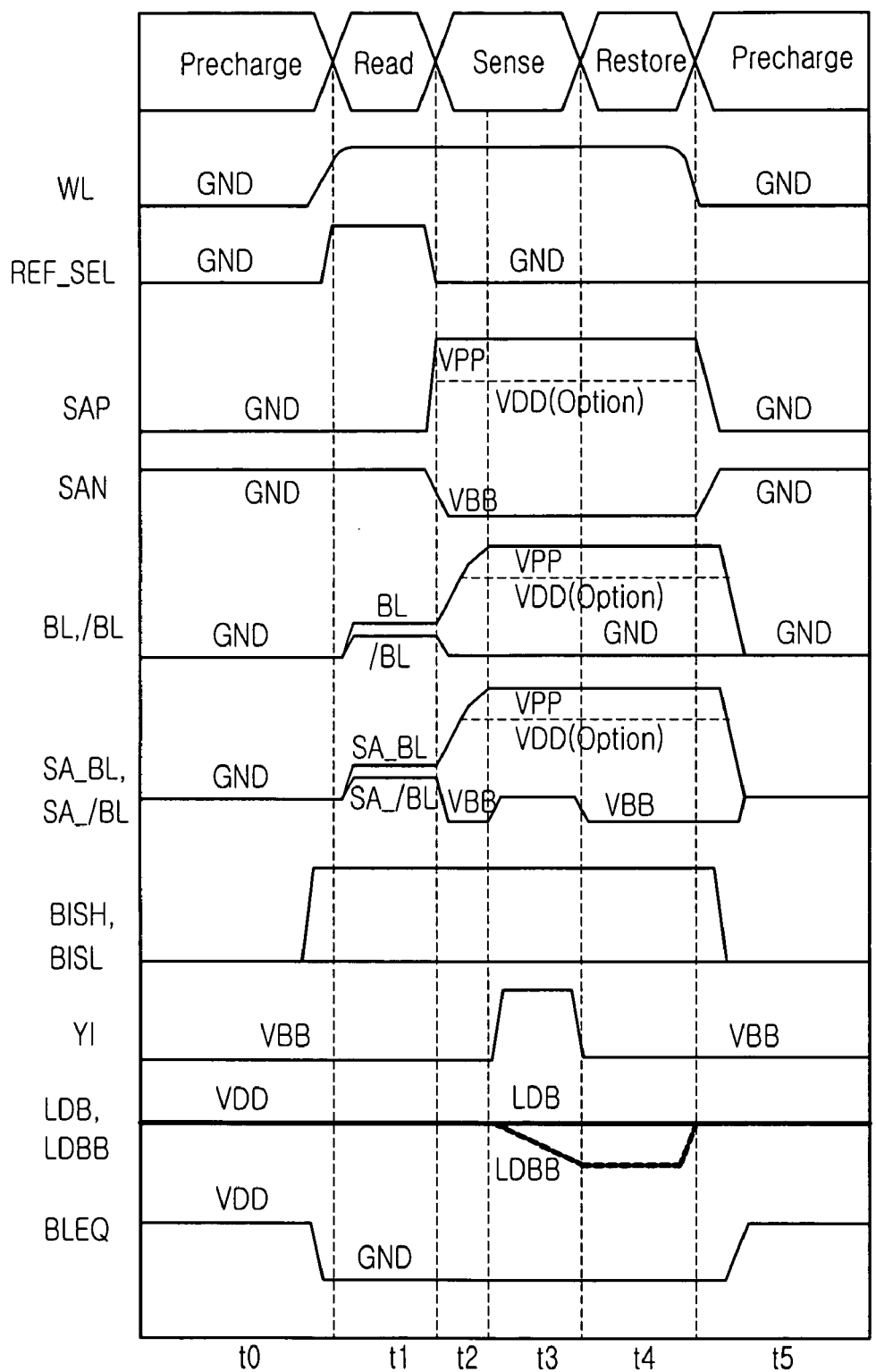
FIG. 15 is a waveform showing an operation of the semiconductor memory device shown in FIG. 14.

FIG. 15 is a waveform showing an operation of the semiconductor memory device shown in FIG. 14.

As shown, the operation of the semiconductor memory device is very similar to above described operation shown in FIG. 9. However, since the semiconductor memory device has a folded structure, there are the first and the second connection control signals BISH and BISL in order to connect or disconnect one of the first and the second cell arrays, i.e., 300c and 300d, to the sense amplifier 210'.

Referring to FIG. 15, the first connection signal BISH is activated and the second connection signal BISL is inactivated during the read step t1, the sense step t2 and t3 and the restore step t4. That is, it means that the first cell array 300c and the first reference cell block 400c are coupled to the sense amplifier 210' and the second cell array 300d and the second reference cell block 400d are not coupled to the sense amplifier 210'.

Otherwise, if the first connection signal BISH is inactivated and the second connection signal BISL is activated, the second cell array 300d and the second reference cell block 400d are coupled to the sense amplifier 210'.

Meanwhile, the auxiliary sense amplifying block 260' serves to stably maintain one of the bit line BL and the bit line bar /BL as the ground GND.

Figure 16:
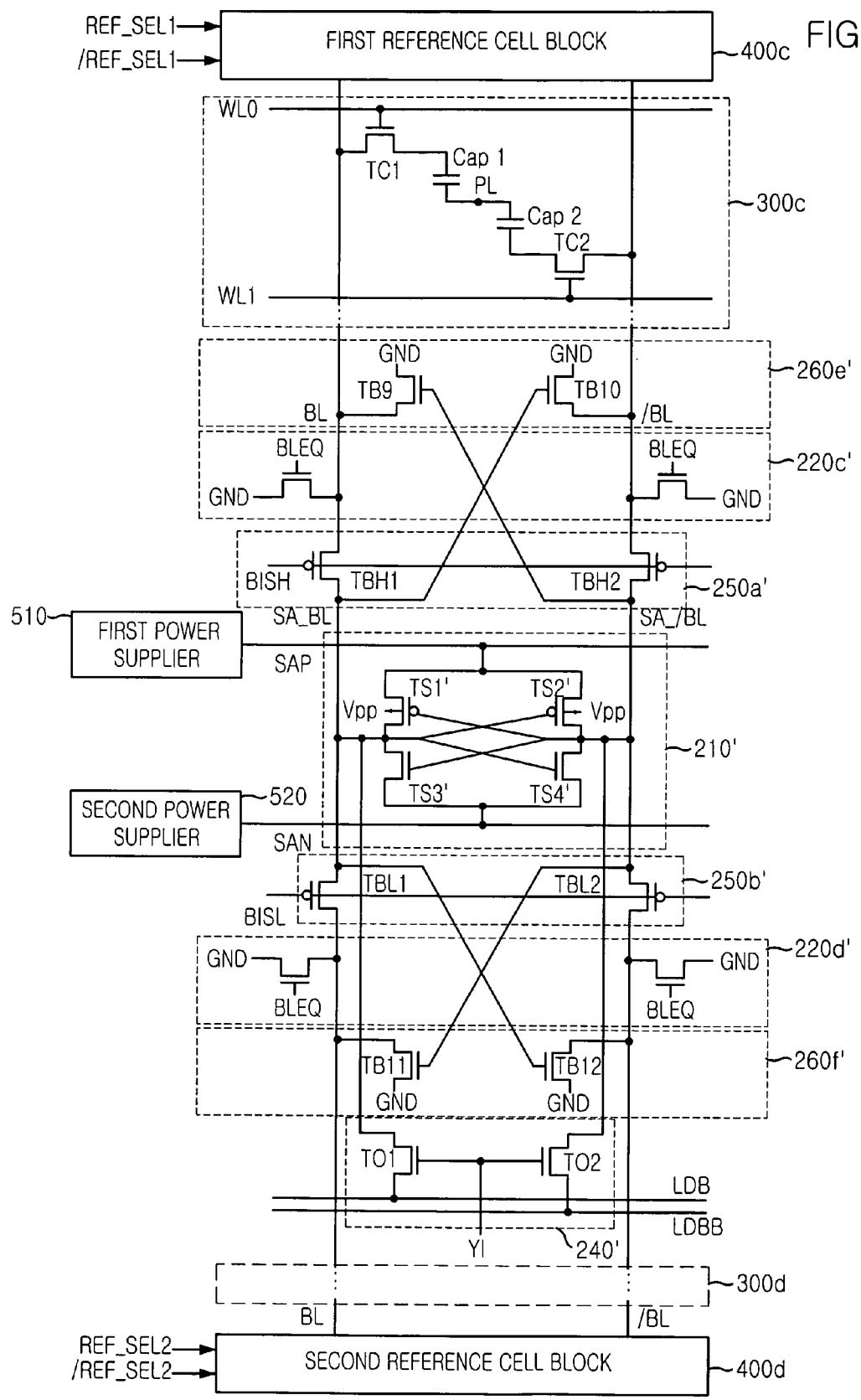
FIG. 16 is a second block diagram minutely describing the core area of the semiconductor memory device shown in FIG. 13.

FIG. 16 is a second block diagram minutely describing the core area of the semiconductor memory device shown in FIG. 13.

In comparison with the core area shown in FIG. 14, an auxiliary sense amplifying block 260' including a first auxiliary sense amplifier 260e and a second auxiliary sense amplifier is differently connected in the core area.

That is, the first auxiliary sense amplifier 260e' includes a fifth NMOS transistor TB9 one end of which is coupled to the ground GND and the other end of which is coupled to the bit line BL; and a sixth NMOS transistor TB10 one end of which is coupled to the ground GND and the other end of which is coupled to the bit line bar /BL. Herein, a gate of the fifth NMOS transistor TB9 is coupled to the sense amplifier coupled bit line bar SA_/BL, and a gate of the sixth NMOS transistor TB10 is coupled to the sense amplifier coupled bit line SA_BL.

Likewise, the second auxiliary sense amplifier 260f' includes a seventh NMOS transistor TB11 one end of which is coupled to the ground GND and the other end of which is coupled to the bit line BL; and an eighth NMOS transistor TB12 one end of which is coupled to the ground GND and the other end of which is coupled to the bit line bar /BL. Herein, a gate of the seventh NMOS transistor TB11 is coupled to the sense amplifier coupled bit line bar SA_/BL, and a gate of the eighth NMOS transistor TB12 is coupled to the sense amplifier coupled bit line SA_BL.

Operations of the first and the second auxiliary sense amplifiers 260e' and 260f' are same to those of the first and the second auxiliary sense amplifier 260c' and 260d' shown in FIG. 14.

In the present invention, a semiconductor memory device is operated in a fast speed under a low power condition, e.g., under 1.5 V, and protects a bleed current from generating to thereby reduce a power consumption.

Also, as compared with the case when the bit line and the bit line bar is precharged as the ½ core voltage, the operation margin of the sense amplifier can be dramatically improved, i.e., stably operated under a noise.

In the semiconductor memory device according to the present invention, a bleed current is eliminated because there is no voltage difference between one of the bit line and the bit line bar and the inactivated word line. Thus, the semiconductor memory device can be reduce a power consumption and a current consumption.

In addition, an operation speed of the sense amplifier becomes faster because the sense amplifier is operated by using the high voltage VPP having a higher voltage level than the core voltage Vcore though the voltage level of the supply voltage becomes lower.

Further, the semiconductor memory device according to the present invention can reduce the period of the restore step. As a result, in the semiconductor memory device according to the present invention, an operation cycle in response to the inputted command, e.g., read or write command, can become shorter. In the conventional semiconductor memory device, since the local data line LDB and the local data line bar LDBB are precharged as the supply voltage VDD or the ½ supply voltage ½ VDD when any data is transmitted through the the local data line LDB and the local data line bar LDBB, a voltage level of the bit line bar /BL amplified to the ground GND by the sense amplifier 210 is increased to a predetermined level by the supply voltage VDD or the ½ supply voltage ½ VDD. However, the bit line bar /BL in the sense amplifier 210 is amplified to the low voltage VBB having a lower voltage level than the ground GND in the present invention. Thus, because of the low voltage VBB, a voltage level of the bit line bar /BL is little increased if the supply voltage VDD or the half supply voltage, i.e., ½ VDD, is supplied to the bit line bar /BL in the sense amplifier 210.

The present application contains subject matter related to Korean patent application No. 2004-87651, filed in the Korean Patent Office on Oct. 30, 2004, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. An apparatus included in a semiconductor memory device for precharging a bit line and a bit line bar and sensing and amplifying a data delivered to one of the bit line and the bit line bar, comprising:
   a precharge means for precharging the bit line and the bit line bar as a ground;
   a sense amplifying means for sensing and amplifying the data by using a low voltage having a lower voltage level than the ground and a high voltage having a higher voltage level than a supply voltage; and
   an auxiliary sense amplifying means coupled to the bit line and the bit line bar for controlling each voltage level of the bit line and the bit line bar,
   wherein the auxiliary sense amplifying means adjusts one of the bit line and the bit line bar depending on which has a lower voltage level than the other to the ground when the data are sensed and amplified by the sense amplifying means.

2. The apparatus as recited in claim 1, wherein the auxiliary sense amplifying means includes:
   a first switch coupled to the ground and the bit line for connecting the ground to the bit line; and
   a second switch coupled to the ground and the bit line bar for connecting the ground to the bit line bar.

3. The apparatus as recited in claim 2, wherein the first switch is a first MOS transistor one end of which is coupled to the ground, and the second switch is a second MOS transistor one end of which is coupled to the ground, wherein a gate of the first MOS transistor and the other end of the second MOS transistor are commonly coupled to the bit line bar, and a gate of the second MOS transistor and the other end of the first MOS transistor are commonly coupled to the bit line.

4. The apparatus as recited in claim 3, wherein the supply voltage and the ground are inputted outside of the semiconductor memory device.

5. The apparatus as recited in claim 4, further comprising an internal voltage generator for receiving the supply voltage and the ground to thereby generate the low voltage and the high voltage.

6. The apparatus as recited in claim 5, further comprising:
   a first voltage supplying block for supplying one of the low voltage and the ground to the sense amplifying means in response to a first power control signal and a second power control signal; and
   a second voltage supplying block for supplying one of the high voltage and the ground to the sense amplifying means in response to a third power control signal and the second power control signal.

7. The apparatus as recited in claim 6, wherein the first voltage supplying block includes:
   a third MOS transistor for outputting the high voltage to the sense amplifying means in response to the first power control signal; and
   a fourth MOS transistor for outputting the ground to the sense amplifying means in response to the second power control signal.

8. The apparatus as recited in claim 7, wherein the second voltage supplying block includes:
   a fifth MOS transistor for outputting the low voltage to the sense amplifying means in response to the third power control signal; and
   a sixth MOS transistor for outputting the ground to the sense amplifying means in response to the second power control signal.

9. The apparatus as recited in claim 1, further comprising:
   at least one cell array for outputting a stored data to one of the bit line and the bit line bar in response to inputted address and command; and
   at least one reference cell array for outputting a reference signal to the other of the bit line and the bit line bar.

10. The apparatus as recited in claim 9, wherein one cell array is respectively coupled to the sense amplifying means through a plurality of bit lines and the other cell array is coupled to the sense amplifying means through a plurality of bit line bars.

11. The apparatus as recited in claim 9, wherein one cell array is coupled to the sense amplifying means through a plurality of bit lines and a plurality of bit line bars and the other cell array is not coupled to the sense amplifying means.

12. The apparatus as recited in claim 9, further comprising a first connection block located between the precharge means and the sense amplifying means for delivering a data loaded in the bit line or the bit line bar into the sense amplifying means and preventing the low voltage from delivering into the bit line and the bit line bar respectively coupled to the cell array.

13. The apparatus as recited in claim 12, wherein the precharge means includes:
   a first MOS transistor for receiving a precharge signal and supplying the ground to the bit line as the precharge voltage in response to the precharge signal; and
   a second MOS transistor for receiving the precharge signal and supplying the ground to the bit line bar as the precharge voltage in response to the precharge signal.

14. The apparatus as recited in claim 13, wherein the first connection block includes:
   a first transistor for delivering a data loaded in the bit line into the sense amplifying means and preventing the low voltage from delivering into the bit line in response to a bit line control signal; and
   a second transistor for delivering a data loaded in the bit line bar into the sense amplifying means and preventing the low voltage from delivering into the bit line bar in response to the bit line control signal.

15. The apparatus as recited in claim 14, wherein the sense amplifying means includes:
   a first PMOS transistor having a gate, a drain and a source, the gate coupled to the bit line bar, the source for receiving one of the core voltage and the high voltage and the drain coupled to the bit line;
   a second PMOS transistor having a gate, a drain and a source, the gate coupled to the bit line, the source for receiving one of the core voltage and the high voltage and the drain coupled to the bit line bar;
   a first NMOS transistor having a gate, a drain and a source, the gate coupled to the bit line bar, the source for receiving the ground and the drain coupled to the bit line; and
   a second NMOS transistor having a gate, a drain and a source, the gate coupled to the bit line, the source for receiving the ground and the drain coupled to the bit line bar.

16. The apparatus as recited in claim 1, further comprising a data output means for delivering the data amplified by the sense amplifying means into a data line and a data line bar or delivering an inputted data through the data line and the data line bar into the sense amplifying means.

17. The apparatus as recited in claim 16, wherein the data output means includes:
   a first MOS transistor coupled between the bit line and the data line for delivering a data loaded in the bit line into the data line; and
   a second MOS transistor coupled between the bit line bar and the data line bar for delivering a data loaded in the bit line bar into the data line bar.

18. A method for precharging a bit line and a bit line bar and sensing and amplifying a data delivered to one of the bit line and the bit line bar in the semiconductor memory device, comprising the steps of:
   a) precharging the bit line and the bit line bar as a ground;
   b) sensing and amplifying the data by using a low voltage having a lower voltage level than the ground and a high voltage having a higher voltage level than a supply voltage; and
   c) adjusting one of the bit line and the bit line bar depending on which has a lower voltage level to the ground when the data are sensed and amplified.

19. The method as recited in claim 18, further comprising the step of d) receiving the supply voltage and the ground to thereby generate the low voltage and the high voltage.

20. The method as recited in claim 19, further comprising the steps of:
   e) outputting a stored data to one of the bit line and the bit line bar in response to inputted address and command; and
   f) outputting a reference signal to the other of the bit line and the bit line bar.

21. The method as recited in claim 20, wherein the b) includes the steps of:
   b1) supplying one of the low voltage and the ground to the sense amplifying means in response to a first power control signal and a second power control signal; and
   b2) supplying one of the high voltage and the ground to the sense amplifying means in response to a third power control signal and the second power control signal.

22. The method as recited in claim 21, further comprising the step of g) delivering the data amplified by the sense amplifying means into a data line and a data line bar or delivering an inputted data through the data line and the data line bar into the sense amplifying means.

23. A semiconductor memory device, comprising:
   a first cell array having a plurality of unit cells each for storing a data and outputting the data to one of a bit line and a bit line bar in response to inputted address and command;
   a precharge means for precharging the bit line and the bit line bar as a ground;
   a sense amplifying means for sensing and amplifying the data by using a low voltage having a lower voltage level than the ground and a high voltage having a higher voltage level than the core voltage; and
   an auxiliary sense amplifying means coupled to the bit line and the bit line bar for controlling each voltage level of the bit line and the bit line bar,
   wherein the auxiliary sense amplifying means adjust one of the bit line and the bit line bar depending on which has a lower voltage level to the ground when the data are sensed and amplified by the sense amplifying means.

24. The semiconductor memory device as recited in claim 23, wherein the auxiliary sense amplifying means includes:
   a first switch coupled to the ground and the bit line for connecting the ground to the bit line; and
   a second switch coupled to the ground and the bit line bar for connecting the ground to the bit line bar.

25. The semiconductor memory device as recited in claim 24, wherein the first switch is a first MOS transistor one end of which is coupled to the ground, and the second switch is a second MOS transistor one end of which is coupled to the ground, wherein a gate of the first MOS transistor and the other end of the second MOS transistor are commonly coupled to the bit line bar, and a gate of the second MOS transistor and the other end of the first MOS transistor are commonly coupled to the bit line.

26. The semiconductor memory device as recited in claim 25, wherein the supply voltage and the ground are inputted outside of the semiconductor memory device.

27. The semiconductor memory device as recited in claim 26, further comprising an internal voltage generator for receiving the supply voltage and the ground to thereby generate the low voltage and the high voltage.

28. The semiconductor memory device as recited in claim 27, further comprising:
- a first voltage supplying block for supplying one of the low voltage and the ground to the sense amplifying means in response to a first power control signal and a second power control signal; and
- a second voltage supplying block for supplying one of the high voltage and the ground to the sense amplifying means in response to a third power control signal and the second power control signal.

29. The semiconductor memory device as recited in claim 28, wherein the first voltage supplying block includes:
- a third MOS transistor for outputting the high voltage to the sense amplifying means in response to the first power control signal; and
- a fourth MOS transistor for outputting the ground to the sense amplifying means in response to the second power control signal.

30. The semiconductor memory device as recited in claim 29, wherein the second voltage supplying block includes:
- a fifth MOS transistor for outputting the low voltage to the sense amplifying means in response to the third power control signal; and
- a sixth MOS transistor for outputting the ground to the sense amplifying means in response to the second power control signal.

31. The semiconductor memory device as recited in claim 23, further comprising a reference cell array for outputting a reference signal to the other of the bit line and the bit line bar.

32. The semiconductor memory device as recited in claim 31, wherein one cell array is respectively coupled to the sense amplifying means through a plurality of bit lines and the other cell array is coupled to the sense amplifying means through a plurality of bit line bars.

33. The semiconductor memory device as recited in claim 31, wherein one cell array is coupled to the sense amplifying means through a plurality of bit lines and a plurality of bit line bars and the other cell array is not coupled to the sense amplifying means.

34. The semiconductor memory device as recited in claim 31, further comprising a connection control block located between the precharge means and the sense amplifying means for delivering a data loaded in the bit line or the bit line bar into the sense amplifying means and preventing the low voltage from delivering into the bit line and the bit line bar respectively coupled to the cell array.

35. The semiconductor memory device as recited in claim 34, wherein the precharge means includes:
- a first MOS transistor for receiving a precharge signal and supplying the ground to the bit line as the precharge voltage in response to the precharge signal; and
- a second MOS transistor for receiving the precharge signal and supplying the ground to the bit line bar as the precharge voltage in response to the precharge signal.

36. The semiconductor memory device as recited in claim 35, wherein the connection control block includes:
- a first transistor for delivering a data loaded in the bit line into the sense amplifying means and preventing the low voltage from delivering into the bit line in response to a bit line control signal; and
- a second transistor for delivering a data loaded in the bit line bar into the sense amplifying means and preventing the low voltage from delivering into the bit line bar in response to the bit line control signal.

37. The semiconductor memory device as recited in claim 36, wherein the sense amplifying means includes:
- a first PMOS transistor having a gate, a drain and a source, the gate coupled to the bit line bar, the source for receiving one of the core voltage and the high voltage and the drain coupled to the bit line;
- a second PMOS transistor having a gate, a drain and a source, the gate coupled to the bit line, the source for receiving one of the core voltage and the high voltage and the drain coupled to the bit line bar;
- a first NMOS transistor having a gate, a drain and a source, the gate coupled to the bit line bar, the source for receiving the ground and the drain coupled to the bit line; and
- a second NMOS transistor having a gate, a drain and a source, the gate coupled to the bit line, the source for receiving the ground and the drain coupled to the bit line bar.

38. The semiconductor memory device as recited in claim 23, further comprising a data output means for delivering the data amplified by the sense amplifying means into a data line and a data line bar or delivering an inputted data through the data line and the data line bar into the sense amplifying means.

39. The semiconductor memory device as recited in claim 38, wherein the data output means includes:
- a first MOS transistor coupled between the bit line and the data line for delivering a data loaded in the bit line into the data line; and
- a second MOS transistor coupled between the bit line bar and the data line bar for delivering a data loaded in the bit line bar into the data line bar.

40. The semiconductor memory device as recited in claim 23, further comprising:
- a second cell array having a plurality of unit cells each for storing a data and outputting the data to one of a bit line and a bit line bar in response to the inputted address and command;
- a first array selection block for connecting or disconnecting the first cell array to the sense amplifying means in response to a first connection signal; and
- a second array selection block for connecting or disconnecting the second cell array to the sense amplifying means in response to a second connection signal.

41. The semiconductor memory device as recited in claim 40, wherein the first and the second array selection signals based on the inputted address and command are activated during a precharging operation.

* * * * *